United States Patent
Ishikawa et al.

(10) Patent No.: US 6,927,421 B2
(45) Date of Patent: Aug. 9, 2005

(54) HEAT SINK MATERIAL

(75) Inventors: Shuhei Ishikawa, Handa (JP); Tsutomu Mitsui, Chita-Gun (JP); Hiroyuki Takeuchi, Handa (JP); Seiji Yasui, Handa (JP); Ken Suzuki, Handa (JP); Nobuaki Nakayama, Tokai (JP)

(73) Assignee: NGK Insulators, Ltd., Nagoya (JP)

( * ) Notice: Subject to any disclaimer, the term of this patent is extended or adjusted under 35 U.S.C. 154(b) by 176 days.

(21) Appl. No.: 10/279,959

(22) Filed: Oct. 24, 2002

(65) Prior Publication Data

US 2003/0082393 A1 May 1, 2003

(30) Foreign Application Priority Data

Sep. 18, 2002 (JP) ........................................ 2002-272133

(51) Int. Cl.⁷ .............................................. H01L 32/12
(52) U.S. Cl. ........................ 257/76; 428/408; 428/469; 428/446; 428/698
(58) Field of Search ............................ 257/76; 428/408, 428/469, 446, 698

(56) References Cited

U.S. PATENT DOCUMENTS

| | | | |
|---|---|---|---|
| 5,053,195 A | 10/1991 | MacKay | |
| 5,259,436 A | 11/1993 | Yun et al. | |
| 6,031,285 A | * 2/2000 | Nishibayashi | ............... 428/325 |
| 6,114,413 A | 9/2000 | Kang et al. | |
| 6,270,848 B1 | 8/2001 | Nishibayashi | |

FOREIGN PATENT DOCUMENTS

| | | |
|---|---|---|
| EP | 0 859 410 A2 | 8/1998 |
| EP | 0 898 310 A2 | 2/1999 |
| EP | 0 987 231 A1 | 3/2000 |
| EP | 1 000 915 A2 | 5/2000 |
| EP | 1 143 512 A2 | 10/2001 |
| EP | 1 160 860 A1 | 12/2001 |
| EP | 1 284 250 A1 | 2/2003 |
| EP | 1 291 913 A2 | 3/2003 |
| JP | 53-064474 | 6/1978 |
| JP | 59-228742 | 12/1984 |
| JP | 62-207832 | * 9/1987 |
| JP | 8-279569 | 10/1996 |
| JP | 11-140560 A | 5/1999 |
| JP | 2000-203973 | 7/2000 |
| JP | 2001-007625 | 1/2001 |
| JP | 2001-058255 | 3/2001 |

OTHER PUBLICATIONS

U.S. Appl. No. 09/913,353, filed Aug. 13, 2001, Ishikawa et al.

* cited by examiner

*Primary Examiner*—Archene Turner
(74) *Attorney, Agent, or Firm*—Burr & Brown

(57) ABSTRACT

A mass of graphite is placed into a case, and the case is put into a furnace (step S301). The space in the furnace is heated to produce a porous sintered body of graphite (step S302). Thereafter, the case with the porous sintered body contained therein is removed from the furnace, and put into a cavity in a press (step S303). Then, a molten mass of a metal is poured into the case (step S304), and a punch is inserted into the cavity to press the molten metal into the porous sintered body in the case (step S305).

35 Claims, 42 Drawing Sheets

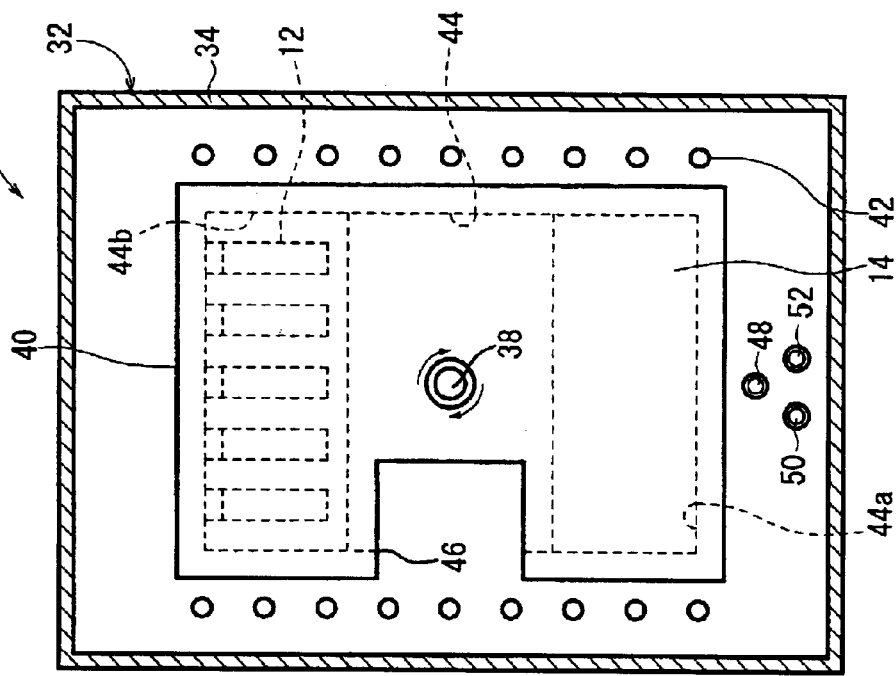
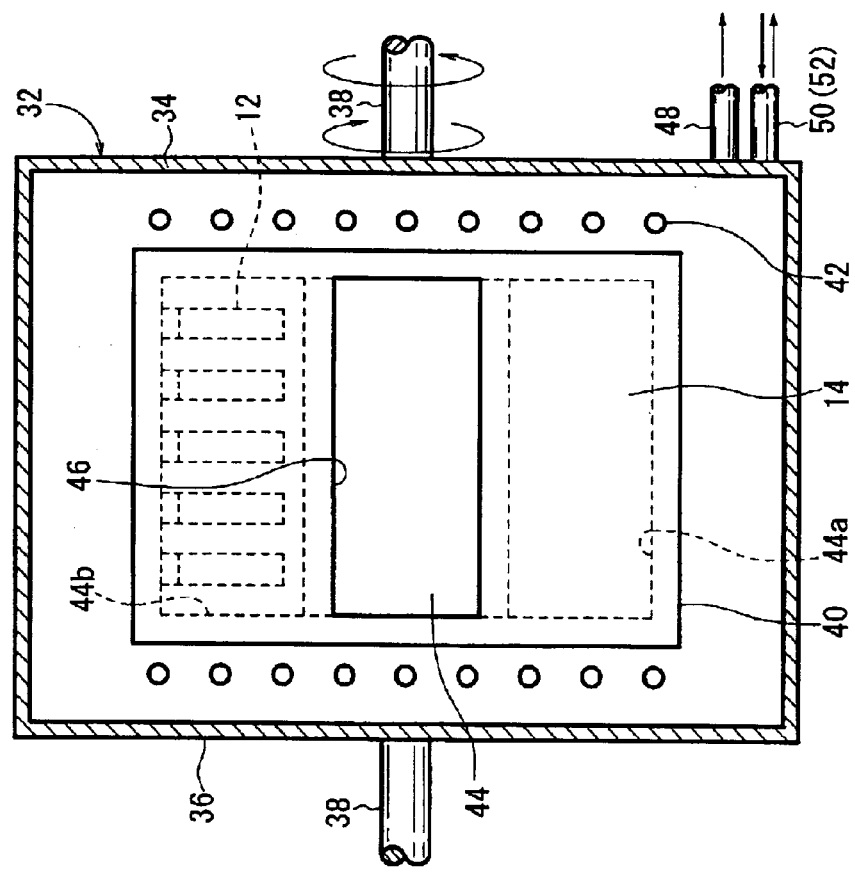

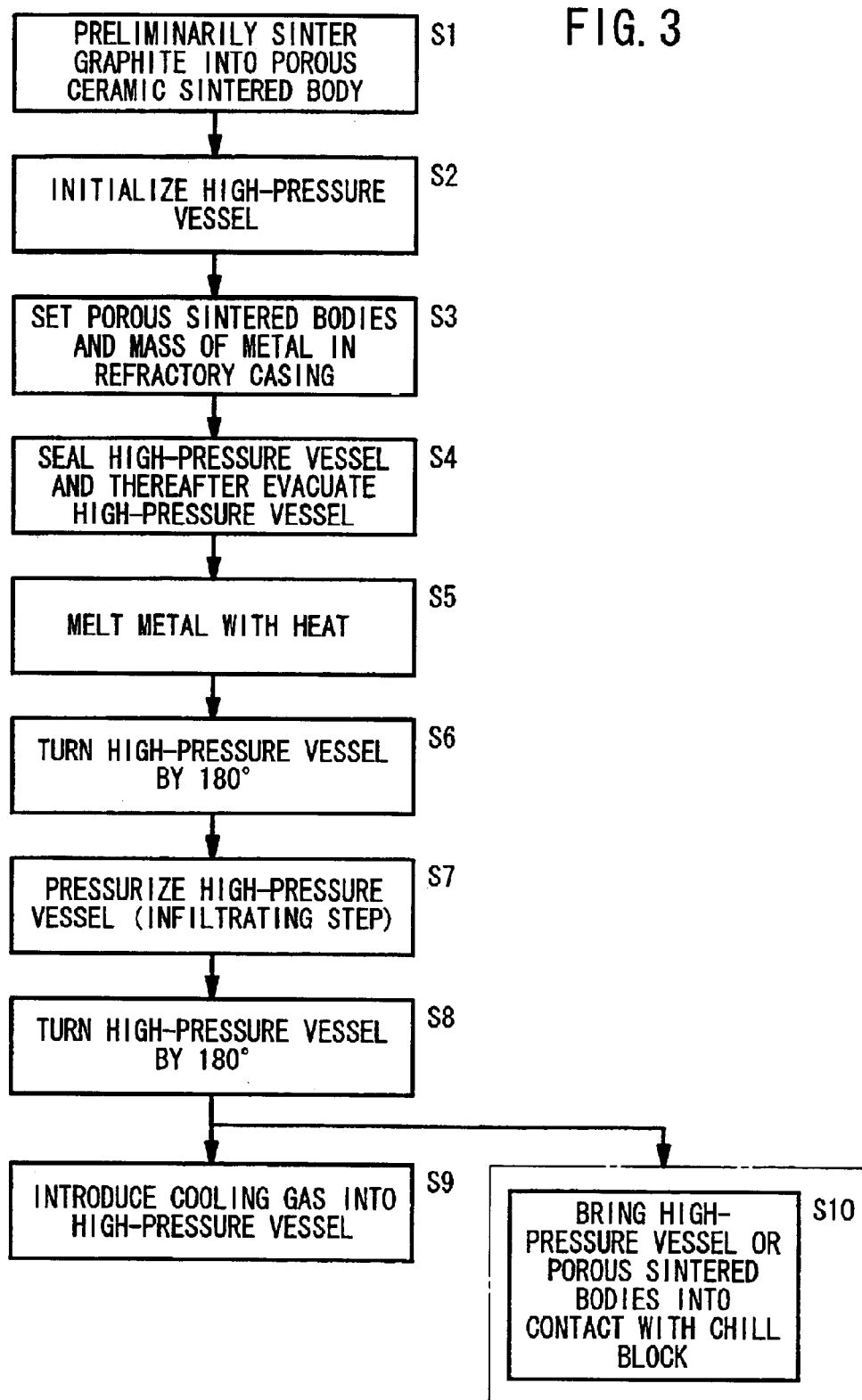

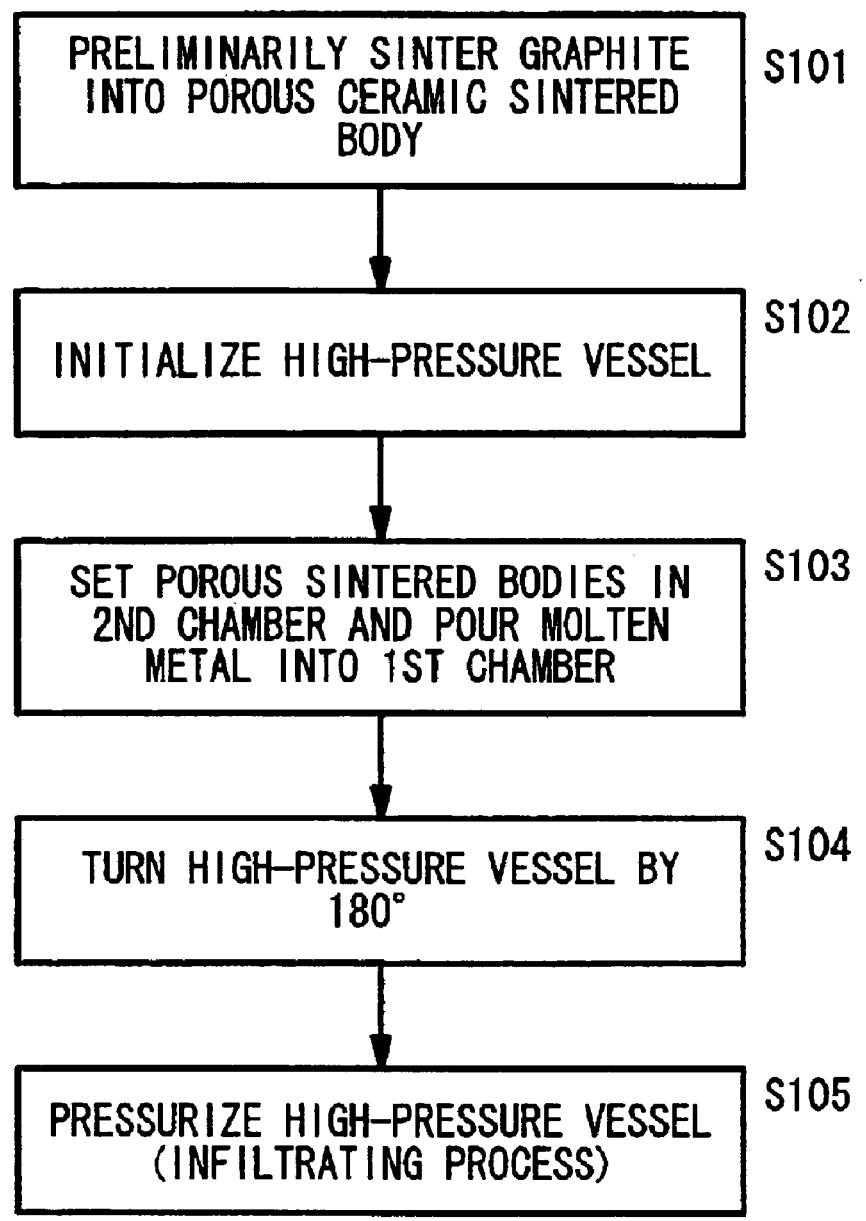

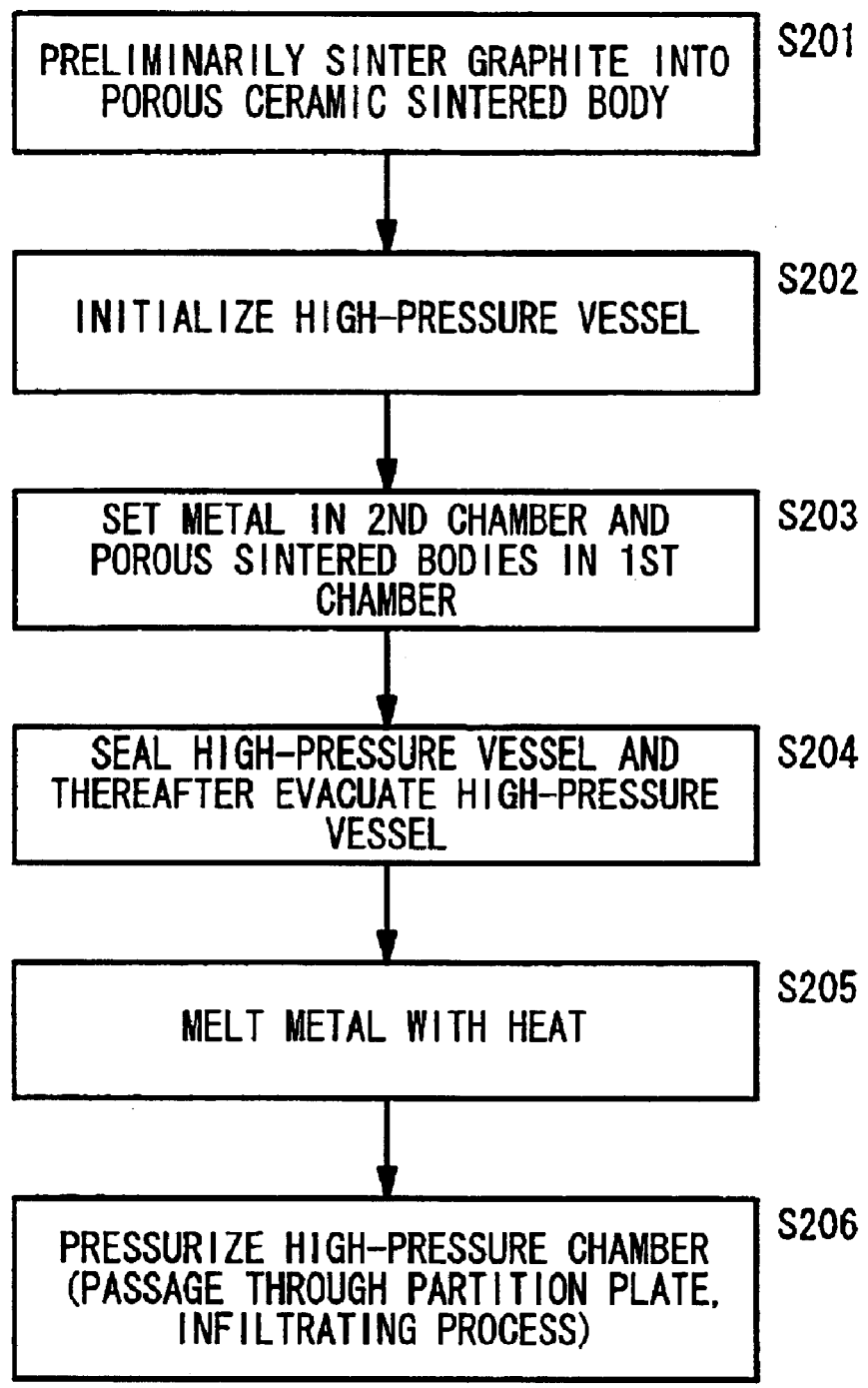

FIG. 14

| LOT NO. | ADDITIVE ELEMENT | ANALYZED VALUE | INFILTRATING PRESSURE | DENSITY (g/cm³) | | | COEFFICIENT OF THERMAL CONDUCTIVITY (z) (W/m·K) | RESIDUAL POROSITY (%) |
|---|---|---|---|---|---|---|---|---|
| | | | | CARBON | ALLOY | INFILTRATING MATERIAL | | |
| 098Z | 70Ni-30Si | Ni = 73.20<br>Si = 26.80 | 160t<br>544kg/cm² | 1.855 | 6.246 | 2.411 | 357 | 8.29 |
| 099Z | 75Al-25Si | Al = 76.40<br>Si = 23.60 | ↑ | ↑ | 2.593 | 2.149 | 392 | 5.85 |
| 100Z | 50Sn-50Cu | Sn = 50.10<br>Cu = 49.80 | ↑ | ↑ | 8.611 | 2.741 | 399 | 6.9 |
| 102Z | 75Sb-25Cu | Sb = 76.50<br>Cu = 23.40 | ↑ | ↑ | 7.452 | 2.796 | 383 | 4.57 |
| 103Z | 70Sb-30Te | Sb = 71.90<br>Te = 28.00 | ↑ | ↑ | 6.626 | 2.701 | 358 | 4.42 |
| 104Z | 60Sb-40Sn | Sb = 63.10<br>Sn = 36.80 | ↑ | ↑ | 6.892 | 2.733 | 399 | 4.45 |
| 105Z | 50Sb-50Sn | Sb = 51.80<br>Sn = 48.10 | ↑ | ↑ | 6.919 | 2.637 | 346 | 5.88 |
| 106Z | 85Sn-15Cu | Sn = 84.70<br>Cu = 15.20 | ↑ | ↑ | 7.652 | 2.73 | 366 | 5.76 |
| 108Z | 15Ni-85Bi | Ni = 14.80<br>Bi = 85.10 | ↑ | ↑ | 10.096 | 3.15 | 400 | 4.37 |

FIG. 15

| LOT NO. | ADDITIVE ELEMENT | ANALYZED VALUE | INFILTRATING PRESSURE | DENSITY (g/cm³) CARBON | DENSITY (g/cm³) ALLOY | DENSITY (g/cm³) INFILTRATING MATERIAL | COEFFICIENT OF THERMAL CONDUCTIVITY (z) (W/m·K) | RESIDUAL POROSITY (%) |
|---|---|---|---|---|---|---|---|---|
| 109Z | 70Sn-30Ni | Sn = 71.90<br>Ni = 28.00 | 544kg/cm² | 1.855 | 8.263 | 2.649 | 355 | 7.58 |
| 110S | 4.5Si-Cu | Si = 4.64<br>Cu = 95.30 | ↑ | ↑ | 8.633 | 2.666 | 357 | 7.8 |
| 119Z | 4.5Si-Cu | Si = 4.48<br>Cu = 95.40 | ↑ | ↑ | 8.422 | 2.607 | 339 | 8.26 |
| 120Z | 4.5Si-1Zr-Cu | Si = 4.43<br>Zr = 0.53<br>Cu = 95.10 | ↑ | ↑ | 8.225 | 2.758 | 348 | 6.21 |
| 122Z | 85Sb-15Bi | Sb = 84.40<br>Bi = 15.50 | ↑ | ↑ | 7.03 | 2.778 | 356 | 4.06 |
| 123Z | 70Sb-1Zr-29Sn | Sb = 74.40<br>Zr = 0.37<br>Sn = 24.30 | ↑ | ↑ | 6.855 | 2.734 | 360 | 4.36 |
| 124Z | 65Sb-1Zr-Cu | Sb = 64.70<br>Zr = 0.69<br>Cu = 34.50 | ↑ | ↑ | 7.379 | 2.714 | 339 | 5.55 |

FIG. 16

| LOT NO. | ADDITIVE ELEMENT | COMPRESSIVE STRENGTH (kgf/mm²) | | | COEFFICIENT OF THERMAL EXPANSION (×10⁻⁶/K) | | |
|---|---|---|---|---|---|---|---|
| | | x | y | z | INFILTRATING MATERIAL | 400°C×1 | 400°C×2 |
| 098Z | 70Ni-30Si | — | — | — | — | — | — |
| 099Z | 75Al-25Si | — | — | — | — | — | — |
| 100Z | 50Sn-50Cu | — | — | — | — | — | — |
| 102Z | 75Sb-25Cu | 5.28 | 5.71 | 6.44 | 5.802 | 4.664 | 4.507 |
| 103Z | 70Sb-30Te | 5.76 | 5.86 | 6.59 | 4.318 | 3.710 | 3.794 |
| 104Z | 60Sb-40Sn | 5.74 | 5.84 | 6.80 | 6.033 | — | — |
| 105Z | 50Sb-50Sn | — | — | — | — | — | — |
| 106Z | 85Sn-15Cu | — | — | — | — | — | — |
| 108Z | 15Ni-85Bi | 5.84 | 5.78 | 6.57 | 5.839 | 5.031 | 4.783 |

FIG. 17

| LOT NO. | ADDITIVE ELEMENT | COMPRESSIVE STRENGTH (kgf/mm²) | | | COEFFICIENT OF THERMAL EXPANSION (×10⁻⁶/K) | | |
|---|---|---|---|---|---|---|---|
| | | x | y | z | INFILTRATING MATERIAL | 400°C×1 | 400°C×2 |
| 109Z | 70Sn-30Ni | – | – | – | – | – | – |
| 110Z | 4.5Si-Cu | 4.89 | 4.89 | 5.70 | 6.078 | 4.478 | 4.289 |
| 119Z | 4.5Si-Cu | – | – | – | – | – | – |
| 120Z | 4.5Si-1Zr-Cu | – | – | – | – | – | – |
| 122Z | 85Sb-15Bi | 5.88 | 5.93 | 6.64 | 5.706 | 4.405 | 3.936 |
| 123Z | 70Sb-1Zr-29Sn | 5.73 | 6.08 | 6.67 | 6.501 | – | – |
| 124Z | 65Sb-1Zr-Cu | 5.14 | 5.19 | 6.00 | 7.362 | 4.248 | 4.021 |

FIG. 20

| LOT NO. | ADDITIVE ELEMENT | INFILTRATING PRESSURE | DENSITY (g/cm³) | | | RESIDUAL POROSITY (%) | MEASURED LOCATION | DENSITY (g/cm³) INFILTRATING MATERIAL | RESIDUAL POROSITY (%) |
|---|---|---|---|---|---|---|---|---|---|
| | | | CARBON | ALLOY | INFILTRATING MATERIAL | | | | |
| 141Z | 95Sb-5Cu | 544kg/cm² | 1.855 | 6.843 | 2.739 | 4.18 | 10a | 2.738 | 4.19 |
| | | | | | | | 10b | 2.743 | 4.12 |
| | | | | | | | 10c | 2.757 | 3.92 |
| | | | | | | | 10d | 2.728 | 4.34 |
| | | | | | | | 10e | 2.730 | 4.31 |
| | | | | | | | 10f | 2.738 | 4.19 |
| 142Z | 95Sb-5Bi | ← | ← | 6.805 | 2.729 | 4.26 | 10a | 2.739 | 4.11 |
| | | | | | | | 10b | 2.736 | 4.15 |
| | | | | | | | 10c | 2.746 | 4.00 |
| | | | | | | | 10d | 2.715 | 4.46 |
| | | | | | | | 10e | 2.713 | 4.49 |
| | | | | | | | 10f | 2.722 | 4.36 |
| 143Z | 95Sb-5Sn | ← | ← | 6.749 | 2.715 | 4.36 | 10a | 2.711 | 4.41 |
| | | | | | | | 10b | 2.714 | 4.37 |
| | | | | | | | 10c | 2.715 | 4.36 |
| | | | | | | | 10d | 2.714 | 4.37 |
| | | | | | | | 10e | 2.707 | 4.47 |
| | | | | | | | 10f | 2.726 | 4.19 |
| 144Z | 95Sb-5Te | ← | ← | 6.641 | 2.714 | 4.16 | 10a | 2.715 | 4.15 |
| | | | | | | | 10b | 2.723 | 4.03 |
| | | | | | | | 10c | 2.731 | 3.91 |
| | | | | | | | 10d | 2.686 | 4.59 |
| | | | | | | | 10e | 2.713 | 4.18 |
| | | | | | | | 10f | 2.718 | 4.10 |

FIG. 21

| LOT NO. | ADDITIVE ELEMENT | INFILTRATING PRESSURE | DENSITY (g/cm$^3$) | | | RESIDUAL POROSITY (%) | MEASURED LOCATION |
|---|---|---|---|---|---|---|---|
| | | | CARBON | ALLOY | INFILTRATING MATERIAL | | |
| 145Z | 95Sb-5Cu | 1592kg/cm$^2$ | 1.855 | 6.843 | 2.797 | 3.42 | 10b |
| 146Z | 4.5Si-Cu | ↑ | ↑ | 8.422 | 2.725 | 6.86 | 10b |

HEAT SINK MATERIAL

BACKGROUND OF THE INVENTION

1. Field of the Invention

The present invention relates to a heat sink material for a heat sink which efficiently radiates heat generated by an IC chip, for example.

2. Description of the Related Art

Generally, IC chips are highly susceptible to heat, and should be designed such that their internal temperature will not exceed an allowable maximum temperature at a junction area of the IC chips. Semiconductor devices such as power transistors and semiconductor rectifiers consume a large amount of electric power per operating area, and cases (packages) and leads of such semiconductor devices may not be effective enough to sufficiently radiate heat generated thereby. Therefore, the internal temperature of those semiconductor devices tends to increase to such a level that the semiconductor devices may suffer a thermal breakdown.

The above phenomenon also occurs in IC chips incorporating CPUs. As the clock frequency of the CPU increases, the IC chip generates more heat while in operation. It is important to design IC chips to incorporate a thermally designed heat radiation structure.

Thermal designs for protecting IC chips against a thermal breakdown include device designs and mount designs which include heat sinks having a large heat radiating area and fixed to IC chip cases (packages).

The heat sinks are generally made of metal such as copper, aluminum, or the like that has good thermal conductivity.

Recently, IC chips such as CPUs, memories, etc. tend to be larger in size because of higher integration of devices and greater areas taken up by devices, while at the same time seeking a low power drive mode for low power consumption. IC chips of greater size are liable to peel off position or be mechanically broken due to increased stresses which are caused by the difference between the coefficient of thermal expansion of the semiconductor substrate (silicon substrate or GaAs substrate) and the coefficient of thermal expansion of the heat sink.

Possible approaches to the prevention of the above drawbacks include a low power drive mode for IC chips and an improvement of heat sink materials. At present, a practical low power drive mode for IC chips has a power supply voltage of 3.3 V rather than the conventional TTL level (5 V).

As for heat sink materials, thermal conductivity is not the only factor to be taken into consideration for their selection, but it has become necessary to select heat sink materials which have a coefficient of thermal expansion that is substantially the same as the coefficient of thermal expansion of silicon and GaAs which the semiconductor substrate is made of, and also have high thermal conductivity.

Various reports have been made with respect to improved heat sink materials. For example, proposed examples of heat sink materials include aluminum nitride (AlN) and Cu—W (copper-tungsten). AlN is suitable for use as a heat sink material for semiconductor devices which use a silicon substrate because it has a coefficient of thermal conductivity and a coefficient of thermal expansion well balanced and particularly because its coefficient of thermal expansion is substantially the same as the coefficient of thermal expansion of Si.

Cu—W is suitable for use as a material of a heat sink which has a complex shape because it is a composite material having a low coefficient of thermal expansion provided by W and a high coefficient of thermal conductivity provided by Cu, and it is easily machinable.

Other examples of heat sink materials include a ceramic base material mainly composed of SiC and containing 20 vol. % to 40 vol. % of Cu (conventional example 1: Japanese laid-open patent publication No. 8-279569) and a powder-sintered porous body of an inorganic material infiltrating 5 wt. % to 30 wt. % of Cu (conventional example 2: Japanese laid-open patent publication No. 59-228742).

The heat sink material according to the conventional example 1 is formed by powder molding that the heat sink material is molded a compressed powder of SiC and Cu into a heat sink. The coefficient of thermal expansion and the coefficient of thermal conductivity of this heat sink material are of theoretical values. Therefore, the theoretical values cannot be balanced against the coefficient of thermal expansion and the coefficient of thermal conductivity of actual electronic parts.

The heat sink material according to the conventional example 2 suffers a limitation on efforts to increase the coefficient of thermal conductivity as the ratio of Cu infiltrated into the powder-sintered porous body is low.

The above heat sink materials are suitable for use as composite materials having high coefficients of thermal conductivity. However, these heat sink materials fail to achieve a desired mechanical strength because residual pores are easily produced in the composite materials as a sufficient pressure for infiltrating the carbon material, such as a ceramic material for the semiconductor base, with the metal cannot be achieved for the reason that the mechanical strength of the carbon material is relatively low.

The residual pores result in a reduction in the coefficient of thermal conductivity of the composite material, an occurrence of voids at the interface between solder and the composite material in the step of soldering the composite material, and a reduction in the wettability between the composite material and the solder.

In recent years, it has become possible to produce a composite material having a high coefficient of thermal conductivity which is achieved by a carbon material only. As a result, the need for infiltrating metal into pores in a carbon material to produce a composite material having a high coefficient of thermal conductivity is decreasing. The metal serves the purpose of reducing residual pores to increase the mechanical strength of the heat sink material by efficiently infiltrating into the carbon material. Other tasks that need to be accomplished quickly include the prevention of soaking of water into residual voids that are produced in the plating step and the prevention of voids, bulging, and peeling which occur due to the water seepage.

SUMMARY OF THE INVENTION

It is therefore an object of the present invention to provide a heat sink material which is produced by infiltrating metal into pores in a carbon material, the heat sink material containing reduced residual pores that are produced when the metal is infiltrated into the heat sink material and having a high mechanical strength that is achieved by improving the wettability between the heat sink material and a plated solder layer which covers the surface of the heat sink material.

According to the present invention, a heat sink material comprises carbon or an allotrope thereof and a metal, the metal comprising a metal having a property of expansion upon solidification or a metal having a property of inhibiting a solidification shrinkage. Since the metal which has its volume expanded or shrunk little in the vicinity of a solidification temperature is infiltrated into the heat sink material, any shrinkage of the metal that occurs in a cooling process from the solidification temperature to the room temperature is reduced. Therefore, residual pores are prevented from being produced in the heat sink material.

The metal comprises a metal selected from the group consisting of Bi, Sb, Ga, and graphite cast iron, or an alloy containing the metal. These metals have a property of expansion upon solidification or inhibiting a solidification shrinkage.

If a metal having a low solidification temperature is selected as the above metal, then any shrinkage of the metal that is cooled from the solidification temperature to the room temperature is reduced. When the heat sink material is incorporated into an actual electronic component and soldered, the heat sink material is reheated. Therefore, it is preferable to select a metal which is not melted with the heat applied in the soldering process, i.e., a metal which has a solidification temperature of 300° C. or higher.

The metal may be a metal having a low level of segregation. If a metal having a low melting point is used, then the primary crystal tends to be segregated and the metal may possibly be melted in a temperature range up to 200° C. as viewed from the phase diagram.

The metal should preferably be a metal having good wettability with respect to the heat sink material. Pores in a carbon material can easily be infiltrated by a metal having good wettability even under a low infiltrating pressure.

The heat sink material should preferably have a coefficient of thermal conductivity of 300 W/mK or higher on the average in the directions of three orthogonal axes or in the direction of any one of the three orthogonal axes.

The carbon or the allotrope thereof, which serves as a base of the heat sink material, should preferably have a coefficient of thermal conductivity of 150 W/mK or higher. If the carbon or the allotrope thereof is free of pores, then it should preferably have a coefficient of thermal conductivity of 200 W/mK or higher, more preferably a coefficient of thermal conductivity of 250 W/mK or higher, or much more preferably a coefficient of thermal conductivity of 300 W/mK or higher. By thus selecting the carbon or the allotrope thereof, the heat sink material has a high coefficient of thermal conductivity being independent of the type of the metal.

The allotrope should preferably be graphite or diamond because they have a high coefficient of thermal conductivity.

The heat sink material comprises a porous sintered body infiltrating the metal, which the porous sintered body constructs a network obtained by sintering the carbon or the allotrope thereof. The porous sintered body has a porosity ranging from 10 vol. % to 50 vol. % and an average pore diameter ranging from 0.1 $\mu$m to 200 $\mu$m.

The carbon or the allotrope thereof has a volume ratio ranging from 50 vol. % to 90 vol. % and the metal has a volume ratio ranging from 50 vol. % to 10 vol. %.

To produce a heat sink material having a high mechanical strength, it is preferable to add an additive to the carbon or the allotrope thereof for reducing a closed porosity when the carbon or the allotrope thereof is sintered. The additive comprises SiC and/or Si. The addition of the additive makes it possible to reduce residual pores which are produced when the carbon or the allotrope thereof is sintered. Particularly, if a preform made up of the carbon or its allotrope is infiltrated by the additive, then a infiltration ratio of the metal is increased, efficiently reducing residual pores.

To improve the wettability at the interface between the porous sintered body and the metal, it is preferable to add an element to the metal, the element comprising at least one element selected from the group consisting of Te, Bi, Pb, Sn, Se, Li, Sb, Tl, and Cd. With the element added, the wettability between the metal and the carbon or its allotrope is increased, allowing the porous sintered body to be infiltrated by the metal under a low pressure, and increasing the bonding strength at the interface. Furthermore, the wettability between the heat sink material and a plated solder layer on the surface of the heat sink material is increased, reducing voids at the interface.

If a carbide layer is formed on a surface of the carbon or the allotrope thereof, then the bonding strength between the carbon or the allotrope and the infiltrating metal is increased by the carbide layer, increasing the coefficient of thermal conductivity and the mechanical strength of the heat sink material. The hardness of the carbide layer itself contributes to the mechanical strength of the heat Sink material. Moreover, the wettability at the interface between the heat sink material and a plated solder layer on the surface of the heat sink material is increased. In addition, the metal can be infiltrated into the porous sintered body under a low pressure, and the metal can be infiltrated into fine pores.

The carbide layer is formed on the basis of a reaction between at least the carbon or the allotrope thereof and an additive element added thereto. The additive element comprises at least one element selected from the group consisting of Nb, Cr, Zr, Be, V, Mo, Al, Ta, Mn, Si, Fe, Co, Ni, Mg, Ca, W, Ti, B, and mish metal.

The heat sink material may be not only made of the porous sintered body and the metal, but also manufactured by mixing a powder of the carbon or the allotrope thereof and water or a binder constitutes a mixture, forming the mixture into a preformed body under a predetermined pressure or sintered into a formed body, and infiltrating the metal into the preformed body or the formed body. Alternatively, a powder of the carbon or the allotrope thereof and a powder of the metal may be mixed to obtain a mixture, and the mixture may be molded under a predetermined pressure. Further alternatively, a liquid phase or a solid-liquid phase of the metal and a powder of the carbon or the allotrope thereof may be mixed to obtain a mixture, and the mixture may be cast to shape. A powder of the carbon or the allotrope thereof may be infiltrated by the metal.

The powder of the carbon or the allotrope thereof has an average particle size ranging from 1 $\mu$m to 500 $\mu$m, an average ratio of length of each particle of said powder is 1:5 or less between a direction in which said particle has a minimum length and a direction in which said particle has a maximum length.

The heat sink material may be manufactured by mixing a crushed and torn material of the carbon or the allotrope thereof and a powder of the metal into a mixture, and forming the mixture to shape under a predetermined pressure.

In the heat sink material thus manufactured, the carbon or the allotrope thereof should preferably have a volume ratio ranging from 20 vol. % to 80 vol. % and the metal should preferably have a volume ratio ranging from 80 vol. % to 20 vol. %.

Preferably, an additive element for increasing the bonding strength between particles of the metal should preferably be added to the heat sink material when the heat sink material is molded. The additive element comprises an element selected from the group consisting of Bi, Te, Sn, Pb, Se, Li, Sb, Tl, and Cd. Preferably, the additive element should be selected from Nb, Zr, Cr, Be, etc. which is difficult to form a solid solution with copper. If an additive element which forms a solid solution with copper only at a weight ratio of at most 0.5 wt. % is added, then there is provided a desired heat sink material whose coefficient of thermal conductivity is not lowered.

It is preferable to add an additive element for increasing the bonding strength between the carbon or the allotrope thereof and the metal when the heat sink material is molded. The additive element should preferably comprise an element selected from the group consisting of Nb, Zr, Cr, Be, V, Mo, Al, Ta, Mn, Si, Fe, Co, Ni, Mg, Ca, W, Ti, B, and mish metal.

An additive element may be added to the carbon or the allotrope thereof for allowing the heat sink material to be reheated after the heat sink material is molded. The heat sink material may be is formed on the basis of a reaction between at least the carbon or the allotrope thereof and the additive element added thereto. The additive element should preferably comprise an element selected from the group consisting of Nb, Zr, Cr, Be, V, Mo, Al, Ta, Mn, Si, Fe, Co, Ni, Mg, Ca, W, Ti, B, and mish metal.

Preferably, a carbide of an additive element is formed on a surface of the carbon or the allotrope thereof. The bonding strength between the carbon or the allotrope and the infiltrating metal is increased by the carbide, increasing the coefficient of thermal conductivity and the mechanical strength of the heat sink material. The hardness of the carbide itself contributes to the mechanical strength of the heat sink material. Moreover, the metal can be infiltrated into the porous sintered body under a low pressure, and the metal can be infiltrated into fine pores. The additive element should preferably comprise an element selected from the group consisting of Nb, Zr, Cr, Be, V, Mo, Al, Ta, Mn, Si, Fe, Co, Ni, Mg, Ca, W, Ti, B, and mish metal.

The heat sink material thus has a residual porosity of 5% or less.

The above and other objects, features, and advantages of the present invention will become more apparent from the following description when taken in conjunction with the accompanying drawings in which preferred embodiments of the present invention is shown by way of illustrative example.

BRIEF DESCRIPTION OF THE DRAWINGS

FIG. 2A is a front elevational view, partly in cross section, of a high-pressure vessel used in a first manufacturing process;

FIG. 2B is a side elevational view, partly in cross section, of the high-pressure vessel shown in FIG. 2A;

FIG. 3 is a flowchart of the first manufacturing process;

FIG. 4 is a flowchart of a first modification of the first manufacturing process;

FIG. 5 is a flowchart of a second modification of the first manufacturing process;

FIG. 14 is a table showing characteristics of heat sink materials manufactured by the second manufacturing process;

FIG. 15 is a table showing characteristics of heat sink materials manufactured by the second manufacturing process;

FIG. 16 is a table showing characteristics of heat sink materials manufactured by the second manufacturing process;

FIG. 17 is a table showing characteristics of heat sink materials manufactured by the second manufacturing process;

FIG. 20 is a table showing porosities and densities of heat sink materials manufactured by the second manufacturing process;

FIG. 21 is a table showing porosities and densities achieved when infiltrating pressures are changed in heat sink materials manufactured by the second manufacturing process;

DETAILED DESCRIPTION OF THE INVENTION

Figure 1:
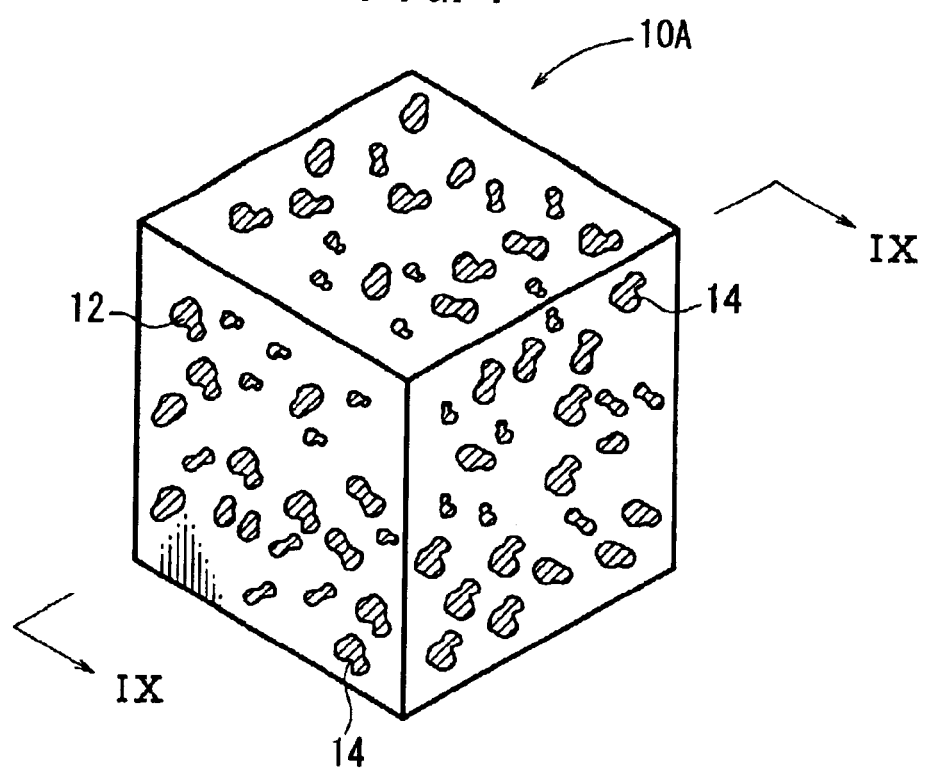
FIG. 1 is perspective view showing a structure of a heat sink material according to a first embodiment of the present invention.

As shown in FIG. 1, a heat sink material 10A according to a first embodiment of the present invention comprises a porous sintered body 12 having a metal 14 infiltrated into a network which is formed by sintering carbon or an allotrope thereof.

The carbon or an allotrope thereof should have a coefficient of thermal conductivity of 150 W/mK or higher, preferably a coefficient of thermal conductivity of 200 W/mK or higher (an estimated value with no pores), more preferably a coefficient of thermal conductivity of 250 W/mK or higher (an estimated value with no pores), or much more preferably a coefficient of thermal conductivity of 300 W/mK or higher (an estimated value with no pores).

According to the first embodiment, the heat sink material 10A comprises a porous sintered body 12 having copper infiltrated into open pores thereof. The porous sintered body 12 is made of graphite having a coefficient of thermal conductivity of 150 W/mK or higher. The metal 14 which infiltrates into the porous sintered body 12 should preferably comprise a metal having a property of expansion upon solidification or a metal having a property of inhibiting a solidification shrinkage, and may be Bi or a metal selected from Pb and graphite cast iron, or an alloy containing at least one of these metals.

The porous sintered body 12 and the metal 14 have volume ratio in the ranges from 50 vol. % to 90 vol. % and from 10 vol. % to 50 vol. %, respectively. The heat sink material 10A thus made up of the porous sintered body 12 and the metal 14 has a coefficient of thermal conductivity of 300 W/mK or higher either on the average in the directions of three orthogonal axes or in the direction of any one of the three orthogonal axes, and a residual porosity of 5% or less.

The porous sintered body 12 should preferably have a porosity in the range from 10 vol. % to 50 vol. %. If the porosity of the porous sintered body 12 were smaller than 10 vol. %, then it would not be possible to achieve a coefficient of thermal conductivity of 300 W/mK or higher (at room temperature) either on the average in the directions of three orthogonal axes or in the direction of any one of the three orthogonal axes. If the porosity of the porous sintered body 12 exceeded 50 vol. %, then the mechanical strength of the porous sintered body 12 would be lowered, failing to keep the residual porosity at 5% or less.

The porous sintered body 12 should preferably have an average open pore diameter (pore diameter) in the range from 0.1 μm to 200 μm. If the pore diameter were less than 0.1 μm, then it would be difficult to infiltrate the metal 14 into the open pores, resulting in a reduction in the coefficient of thermal conductivity of the heat sink material 10A. If the pore diameter were greater than 200 μm, then the mechanical strength of the porous sintered body 12 would be lowered, failing to lower the coefficient of thermal expansion of the heat sink material 10A.

The porous sintered body 12 should preferably have such a distribution of average open pores (pore distribution) that open pores having diameters in the range from 0.5 μm to 50 μm constitute 90% or more of all the pores. If open pores having diameters in the range from 0.5 μm to 50 μm did not constitute 90% or more of all the pores, then the porous sintered body 12 would have more open pores not infiltrated by the metal 14, and the coefficient of thermal conductivity of the heat sink material 10A would be reduced.

The heat sink material 10A made of the porous sintered body 12 infiltrated by the metal 14 should preferably have a closed porosity of 5 vol. % or less. If the closed porosity were in excess of 5 vol. %, then the coefficient of thermal conductivity of the heat sink material 10A would possibly be reduced.

The porosity, pore diameter, and pore distribution were measured using an automatic porosimeter (tradename: Autopore 9200) manufactured by Shimadzu Corp.

In the heat sink material 10A, it is preferable to add to the graphite an additive for lowering the closed porosity at the time the graphite is sintered. The additive may be SiC and/or Si. The additive is effective to reduce closed pores produced at the time the graphite is sintered to increase the rate of infiltration of the porous sintered body 12 with the metal 14.

At least one material selected from Te, Bi, Pb, Sn, Se, Sb, Li, Tl, and Cd should preferably be added to the metal 14 which infiltrates into the porous sintered body 12. The added material improves the wettability of the interface between the porous sintered body 12 and the metal 14, allowing the metal 14 to enter easily into the open pores in the porous sintered body 12.

At least one material selected from Nb, Cr, Zr, Be, V, Mo, Al, Ta, Mn, Si, Fe, Co, Ni, Mg, Ca, W, Ti, B, and mish metal should preferably be added to the metal 14 which infiltrates into the porous sintered body 12. The added material increases the reaction between the graphite and the metal 14, allowing the graphite and the metal 14 to match and closely contact each other in the open pores with ease, and reducing the closed porosity of the heat sink material 10A.

Several processes for manufacturing the heat sink material 10A according to the first embodiment will be described below with reference to FIGS. 2A through 21.

First and second manufacturing processes for manufacturing the heat sink material 10A have the sintering step of producing the porous sintered body 12 which is a network formed by sintering graphite, and the infiltrating step of infiltrating the metal 14 into the porous sintered body 12.

The first manufacturing process is carried out using a high-pressure vessel 30 shown in FIGS. 2A and 2B. The high-pressure vessel 30 comprises a prismatic housing 32 having a pair of parallel spaced side walls 34, 36 supporting respective rotatable shafts 38 on their substantially central areas. The housing 32 can be rotated in unison with the rotatable shafts 38 about their axes.

The housing 32 houses therein a refractory casing 40 and a heater 42 for heating the refractory casing 40. The refractory casing 40 is of a prismatic shape having a hollow space 44 defined therein, and includes a side wall having a vertical opening 46 defined therein which communicates with the hollow space 44. The hollow space 44 includes a space (hereinafter referred to as "first chamber 44a") disposed on one side of the opening 46 for storing a solid or molten mass of the metal 14 as an infiltrating material.

The hollow space 44 includes another space (hereinafter referred to as "second chamber 44b") disposed on the other side of the opening 46 for storing a plurality of porous ceramic sintered bodies 12 as specimens to be infiltrated. The second chamber 44b houses therein a support mechanism for supporting the porous ceramic sintered bodies 12 in the second chamber 44b to prevent the porous ceramic sintered bodies 12 from dropping when the second chamber 44b is positioned above the first chamber 44a. The heater 42 has such a structure as to protect itself against destruction under a high pressure of 300 MPa.

To the high-pressure vessel 30, there are connected a suction pipe 48 for evacuating the high-pressure vessel 30, and a gas inlet pipe 50 and a gas outlet pipe 52 for introducing and discharging a gas for applying a high pressure and a cooling gas.

The first manufacturing process using the high-pressure vessel 30 will be described below with reference to FIG. 3.

In step S1, a rod of graphite is formed, infiltrated by pitch (a type of coal tar), and sintered with heat, thus producing a porous sintered body 12 of graphite.

Specifically, a rod of graphite is formed by mixing a powder of graphite with pitch, and extruding the mixture into a rod of graphite having a diameter ranging from 100 to 600 mm and a length of about 3000 mm, in an atmosphere at a temperature of about 150° C. The rod of graphite thus produced contains many pores and has a low coefficient of thermal conductivity.

The rod of graphite is then deaerated in a vacuum to reduce pores therein, and infiltrated by pitch while in the vacuum. The rod of graphite is sintered at about 1000° C. and then infiltrated by pitch. The above process is repeated three times.

In order to increase the coefficient of thermal conductivity of the rod of graphite, the rod of graphite is heated in a furnace at about 3000° C. To prevent the rod of graphite from burning, the furnace is covered with a powder of carbon, and the rod of graphite itself is also covered with a powder of carbon. Alternatively, the rod of graphite may be heated by directly passing an electric current through the rod of graphite.

The porous sintered body 12 thus produced may preliminarily be machined depending on the shape of a final product to be achieved.

Thereafter, in step S2, the high-pressure vessel 30 is initialized to turn the refractory casing 40 to bring the first chamber 44a thereof into a lower position.

Then, a plurality of porous sintered bodies 12 thus produced and a solid mass of the metal 14 are placed in the refractory casing 40 in step S3. Specifically, the solid mass of the metal 14 is set in the first chamber 44a, and the porous sintered bodies 12 are set in the second chamber 44b. At this time, it is preferable to have the porous sintered bodies 12 preheated. To preheat the porous sintered bodies 12, the porous sintered bodies 12 are housed in a carbon case or covered with a heat insulating material and then preheated. When the porous sintered bodies 12 have reached a predetermined temperature, the porous sintered bodies 12 which are in the carbon case or covered with the heat insulating material are set in the second chamber 44b as described above.

Thereafter, the high-pressure vessel 30 (and the refractory casing 40) is sealed, and evacuated through the suction pipe 48 to develop a negative pressure in the high-pressure vessel 30 in step S4.

Thereafter, the heater 42 is energized to melt the solid mass of metal 14 in the first chamber 44a with heat in step S5. The mass of metal 14 thus melted will hereinafter be referred to as "molten metal 14".

When the molten metal 14 in the first chamber 44a has reached a predetermined temperature, the high-pressure vessel 30 is turned 180° in step S6. Since the first chamber 44a is brought into an upper position, the molten metal 14 in the first chamber 44a drops by gravity into the second chamber 44b in the lower position. Therefore, the molten metal 14 is infiltrated into the porous sintered bodies 12.

Then, an infiltrating gas is introduced through the gas inlet pipe 50 into the high-pressure vessel 30, pressurizing the high-pressure vessel 30 in step S7. Under the pressure developed in the high-pressure vessel 30, the open pores in the porous sintered bodies 12 are infiltrated by the molten metal 14.

After the infiltrating process is finished, a cooling process is immediately initiated. In the cooling process, the high-pressure vessel 30 is turned 180° in step S8. Since the first chamber 44a is brought into the lower position, the molten metal 14 in the second chamber 44a drops by gravity back into the first chamber 44a.

Because a portion of the molten metal 14 has been trapped in the open pores in the porous sintered bodies 12, the molten metal 14 falling into the first chamber 44a in the lower position is a residual molten metal which has not infiltrated into the porous sintered bodies 12. When the residual molten metal has dropped into the first chamber 44a, the porous sintered bodies 12 which are infiltrated by the molten metal 14 are left in the second chamber 44a.

Thereafter, the infiltrating gas in the high-pressure vessel 30 is discharged through the gas outlet pipe 52, and simultaneously a cooling gas is introduced through the gas inlet pipe 50 into the high-pressure vessel 30 in step S9. As the infiltrating gas is discharged and the cooling gas is introduced, the cooling gas is circulated thoroughly in the high-pressure vessel 30, quickly cooling the high-pressure vessel 30. When the high-pressure vessel 30 is quickly cooled, the molten metal 14 which has infiltrated into the porous sintered bodies 12 is solidified into the solid metal 14 and expanded in volume. Therefore, the metal 14 which has infiltrated into the porous sintered bodies 12 is firmly retained in the porous sintered bodies 12.

According to another cooling process, as indicated by the dot-and-dash line in FIG. 3, after step S8, the high-pressure vessel 30 or the porous sintered bodies 12 infiltrated by the metal 14 are delivered into a cooling zone, and brought into a chill block disposed in the cooling zone in step S10.

When contacted by the chill block, the porous sintered bodies 12 are quickly cooled. In this cooling process, the porous sintered bodies 12 may be cooled while a cooling gas is sprayed on the porous sintered bodies 12 or the chill block is being cooled by water. Particularly, it is preferable to cool the porous sintered bodies 12 in view of a effect of dead head.

According to the above steps of the first manufacturing process, the porous sintered body 12 of graphite can easily be infiltrated by the metal 14. The rate of infiltration of the porous sintered body 12 with the metal 14 is increased. The heat sink material 10A thus has a coefficient of thermal conductivity of 300 W/mK or higher either on the average in the directions of three orthogonal axes or in the direction of any one of the three orthogonal axes, and a residual porosity of 5% or less.

If the porous sintered body 12 is made of SiC as described later on, then a heat sink material 10A can easily be produced which has an open porosity of 5% or less in a temperature range from the room temperature to 200° C. and has a coefficient of thermal conductivity of 300 W/mK or higher either on the average in the directions of three orthogonal axes or in the direction of any one of the three orthogonal axes.

When the heater 42 is energized to melt the metal 14 in the first chamber 44a with heat in step S5, the temperature (heated temperature) from which the process goes to step S6 should be 30° C. to 250° C. higher than the melting point of the metal 14 and more preferably be 50° C. to 200° C. higher than the melting point of the metal 14. At this time, it is preferable to keep a vacuum of 0.133 Pa ($1\times10^{-3}$ Torr) or lower in the high-pressure vessel 30.

In step S7, the pressure that is applied to the high-pressure vessel 30 by introducing the infiltrating gas into the high-pressure vessel 30 should be in the range from 0.98 MPa to 202 MPa, preferably from 4.9 MPa to 202 MPa, or more preferably from 9.8 MPa to 202 MPa.

This pressure should preferably higher for the purposes of increasing the rate of infiltration and the cooling capability. However, if the pressure were too high, then the graphite would tend to be broken, and the cost of the facility capable of withstanding the pressure would be high. Therefore, the pressure should be selected in view of these considerations.

The pressure should be applied to the high-pressure vessel 30 for a period of time ranging from 1 to 60 seconds, or preferably from 1 to 30 seconds.

The pores in the porous sintered body 12 should preferably have an average diameter ranging from 0.1 μm to 200 μm and a porosity ranging from 10 vol. % to 50 vol. %.

If the porous sintered body 12 is made of SiC, as described later on, then 90% or more of all the pores in the porous sintered body 12 should preferably have an average diameter ranging from 5 μm to 50 μm, and the porous sintered body 12 should preferably have a porosity ranging from 20 vol. % to 70 vol. %.

In the cooling process, the porous sintered body 12 should be cooled at a rate of −400° C./hour or higher during a period from the temperature at the time of infiltration to 800° C., and preferably a rate of −800° C./hour or higher.

In step S7, the pressure applied to the high-pressure vessel 30 is a pressure required to fully infiltrate the metal 14 into the open pores in the porous sintered body 12. If open pores not infiltrated by the metal 14 remained in the porous sintered body 12, then the thermal conductivity would be greatly impaired. Therefore, it is necessary to apply a high pressure to the high-pressure vessel 30.

The pressure to be applied to the high-pressure vessel 30 can roughly be estimated by the Washburn's equation, and needs to be larger as the pore diameter is smaller. For example, if the pore diameter is 0.1 μm, then the pressure to be applied to the high-pressure vessel 30 is 39.2 MPa, if the pore diameter is 1.0 μm, then the pressure to be applied to the high-pressure vessel 30 is 3.92 MPa, and if the pore diameter is 10 μm, then the pressure to be applied to the high-pressure vessel 30 is 0.392 MPa. Actually, however, a higher pressure needs to be applied to the high-pressure vessel 30 because a material having an average pore diameter of 0.1 μm contains pores having diameters of 0.01 μm or less. Specifically, a pressure of 392 MPa needs to be applied to the high-pressure vessel 30 for infiltrating pores having diameters of 0.01 μm or less with the metal 14.

Some modifications of the first manufacturing process will be described below with reference to FIGS. 4 and 5.

According to a first modification, as shown in FIG. 4, graphite is sintered into a porous sintered body 12 in step S101. The high-pressure vessel 30 is initialized to turn the refractory casing 40 to bring the first chamber 44a thereof into a lower position in step S102.

Then, the porous sintered body 12 is set in the second chamber 44b, and molten metal 14 is poured into the first chamber 44a in step S103.

Thereafter, when the molten metal in the first chamber 44a has reached a predetermined temperature, the high-pressure vessel 30 is turned 180° in step S104. The molten metal 14 in the first chamber 44a drops by gravity into the second chamber 44b in the lower position. Therefore, the porous sintered body 12 is infiltrated by the molten metal 14.

Then, an infiltrating gas is introduced through the gas inlet pipe 50 into the high-pressure vessel 30, pressurizing the high-pressure vessel 30 in step S105. Under the pressure developed in the high-pressure vessel 30, the open pores in the porous sintered body 12 are infiltrated by the molten metal 14.

A second modification will be described below with reference to FIG. 5. In an infiltrating process according to the second modification, a partition plate (not shown) made of a porous ceramic material is disposed centrally in the refractory casing 40 in the high-pressure vessel 30. The partition plate divides the space in the refractory casing 40 into the first chamber 44a and the second chamber 44b.

The partition plate should be made of a porous ceramic material having a porosity ranging from 40 vol. % to 90 vol. % and a pore diameter ranging from 0.5 mm to 3.0 mm, and preferably be made of a porous ceramic material having a porosity ranging from 70 vol. % to 85 vol. % and a pore diameter ranging from 1.0 mm to 2.0 mm.

According to the second modification, as shown in FIG. 5, graphite is sintered into a porous sintered body 12 in step S201. The high-pressure vessel 30 is initialized to turn the refractory casing 40 to bring the first chamber 44a thereof into a lower position in step S202.

Then, the porous sintered body 12 and a solid mass of metal 14 are placed in the refractory casing 40 in the high-pressure vessel 30. Specifically, the solid mass of metal 14 is set in the second chamber 44b in the upper position, and the porous sintered body 12 is set in the first chamber 44a in the lower position step S203.

Thereafter, the high-pressure vessel 30 (and the refractory casing 40) is sealed, and evacuated through the suction pipe 48 to develop a negative pressure in the high-pressure vessel 30 in step S204.

Thereafter, the heater 42 is energized to melt the solid mass of metal 14 in the second chamber 44b with heat in step S205. Then, when the molten metal 14 has reached a predetermined temperature, an infiltrating gas is introduced through the gas inlet pipe 50 into the high-pressure vessel 30, pressurizing the high-pressure vessel 30 in step S206. Under the pressure developed in the high-pressure vessel 30, the molten metal 14 in the second chamber 44b located in the upper position passes through the partition plate, and infiltrates into open pores in the porous sintered body 12 in the first chamber 44b located in the lower position.

A second manufacturing process will be described below with reference to FIGS. 6 through 8. The second manufacturing process uses a furnace 60 (see FIG. 6) for sintering graphite into the porous sintered body 12 and a press 62 (see FIG. 7) for infiltrating the metal 14 into the porous sintered body 12.

Figure 6:
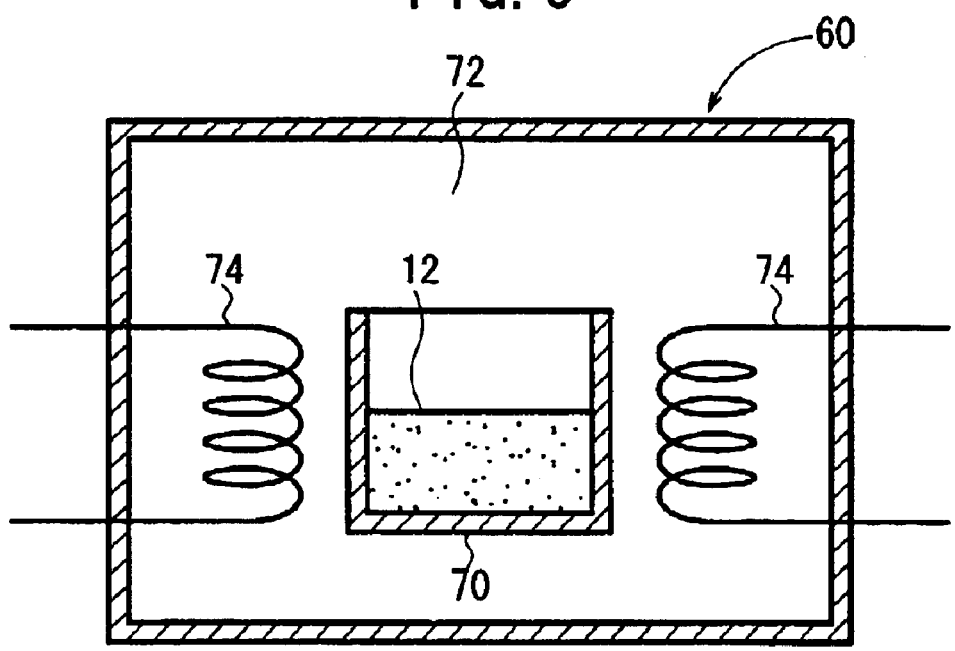
FIG. 6 is a cross-sectional view of a furnace for use in a second manufacturing process.

As shown in FIG. 6, the furnace 60 serves to graphitize carbon and has a space 72 for accommodating a case 70 therein and a heater 74 for heating the case 70 accommodated in the space 72. The case 70 is made of a material such as graphite, ceramics, cerapaper (a heat insulating material of ceramics such as alumina or the like). The case 70 accommodates graphite therein.

Figure 7:
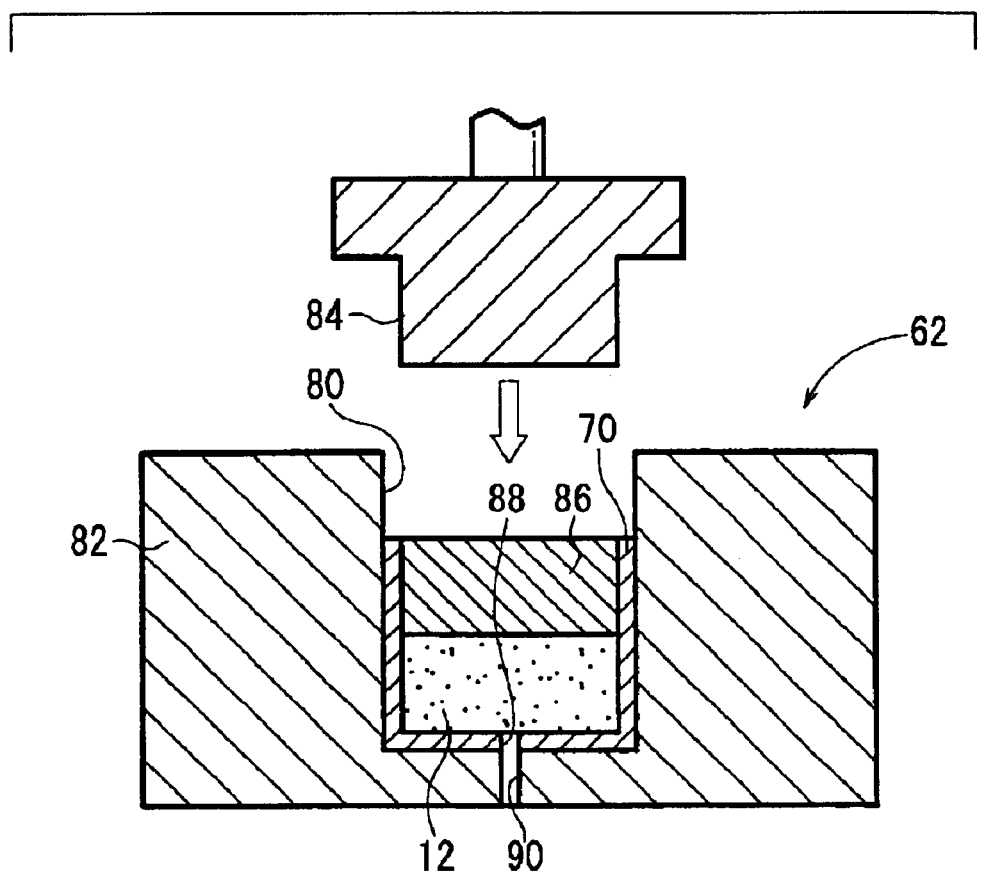
FIG. 7 is a cross-sectional view of a press for use in the second manufacturing process.
Figure 8:
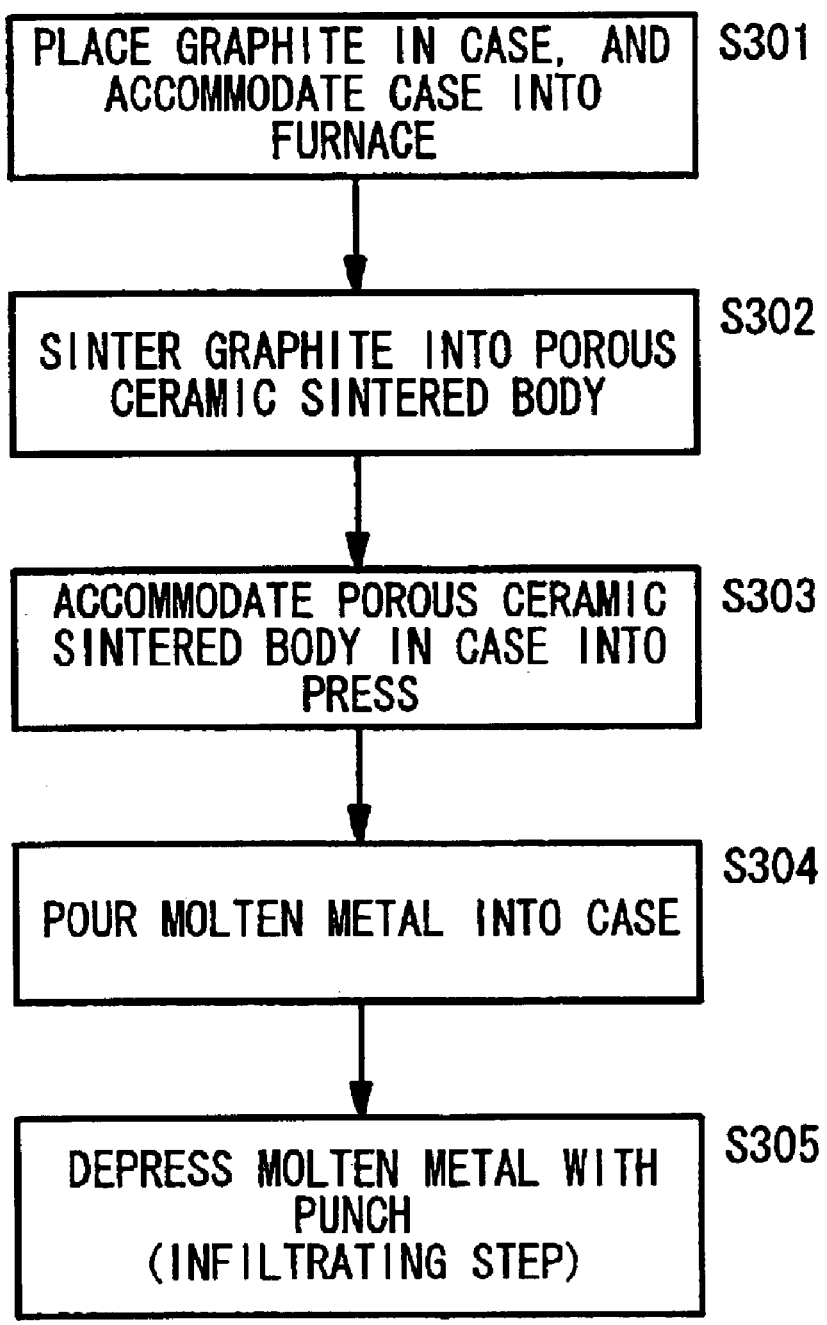
FIG. 8 is a flowchart of the second manufacturing process.

As shown in FIG. 7, the press 62 has a mold 82 having an upwardly open cavity 80, and a punch 84 insertable into the cavity 80 for pressing a content in the cavity 80.

The second manufacturing process using the furnace 60 and the press 62 will be described below with reference to FIGS. 6 through 8.

First, graphite is placed into the case 70, and the case 70 is put into the furnace 60 in step 301. The atmosphere in the furnace 60 is heated to sinter the graphite into a porous sintered body 12 in step S302.

In the sintering step, a current may be passed through the graphite to heat the graphite to about 3000° C. for thereby producing the porous sintered body 12.

Thereafter, the porous sintered body 12 together with the case 70 is removed from the furnace 60, and then placed into the cavity 80 in the press 62 in step S303.

Then, a molten mass 86 of metal 14 is poured into the case 70 in step S304, after which the punch 84 is inserted into the cavity 80 to press the molten metal 86 in the case 70 in step S305. When the molten metal 86 is thus pressed by the punch 84, the open pores in the porous sintered body 12 are infiltrated by the molten metal 86.

In the above second manufacturing process, the punch 84 should press the molten metal 86 preferably under a pressure ranging from 1 MPa to 202 MPa (10 atmospheric pressures to 2000 atmospheric pressures). As shown in FIG. 7, the bottoms of the case 70 and the mold 82 have gas removal holes 88, 90 for removing a gas remaining in the porous sintered body 12 or gaps removing a gas remaining in the porous sintered body 12. When the punch 82 is pressed into the cavity 80, a gas remaining in the porous sintered body 12 is removed through the gas removal holes 88, 90, making it possible to infiltrate the molten metal 86 smoothly into the open pores in the porous sintered body 12.

According to the above steps of the second manufacturing process, the porous sintered body 12 of graphite can easily be infiltrated by the metal 14. The rate of infiltration of the porous sintered body 12 with the metal 14 is increased. The heat sink material 10A thus produced by the above steps of the second manufacturing process has a coefficient of thermal conductivity of 300 W/mK or higher either on the average in the directions of three orthogonal axes or in the direction of any one of the three orthogonal axes, and a residual porosity of 5% or less.

A furnace having a preheating capability may be used instead of the furnace 60. The furnace having a preheating capability preheats the porous sintered body 12 of precompressed powder or graphite. The graphite (or SiC described later on) turned into a network by preheating can easily be infiltrated by the metal 14. The graphite should preferably be preheated to a temperature which is about the same as the temperature of the molten metal 86. Specifically, if the molten metal 86 has a temperature of 1200° C., then the graphite should preferably be preheated to a temperature ranging from 1000° C. to 1400° C.

An experiment will be described below. In this experiment, one type of carbon (graphite) was infiltrated by different metals and different additive elements, and the effects of the additive elements with respect to different densities, different coefficients of thermal conductivity, different coefficients of thermal expansion, and different porosities, after the infiltration, of the heat sink material 10A at different infiltrated locations were observed. The results of the experiment are shown in FIGS. 9 through 21.

Figure 9:
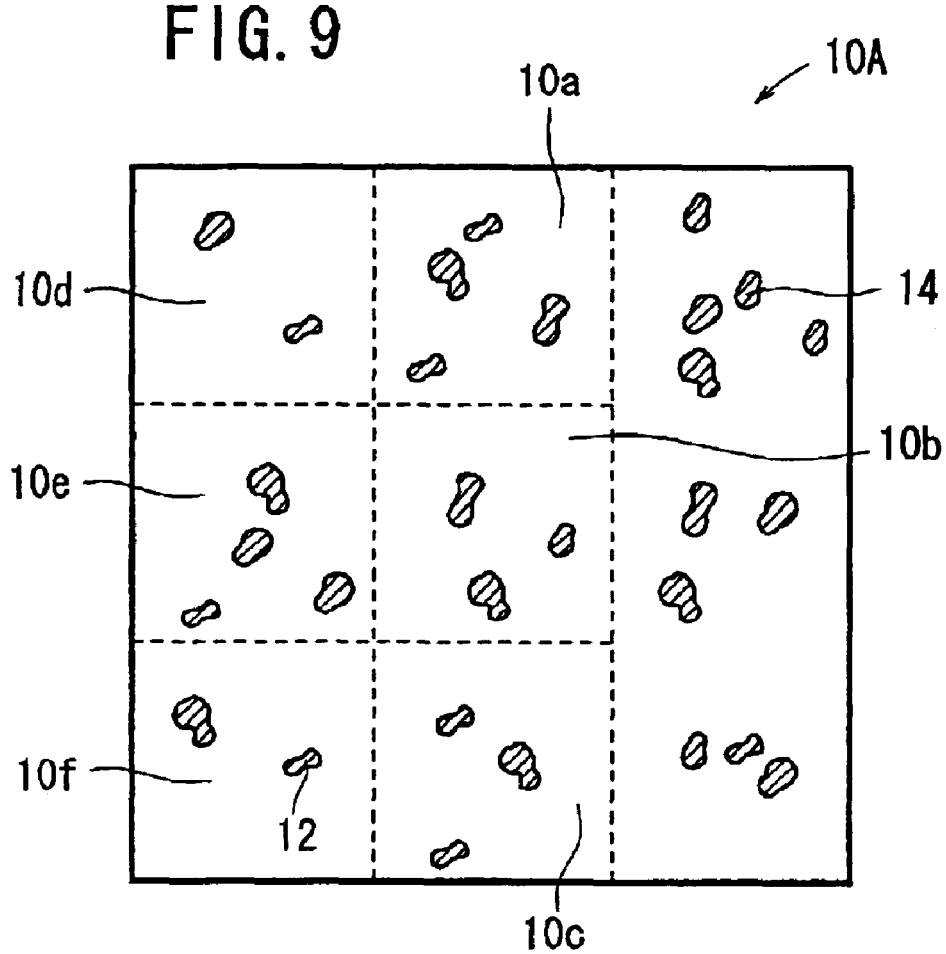
FIG. 9 is a cross-sectional view taken along line IX—IX of FIG. 1.
Figure 10:
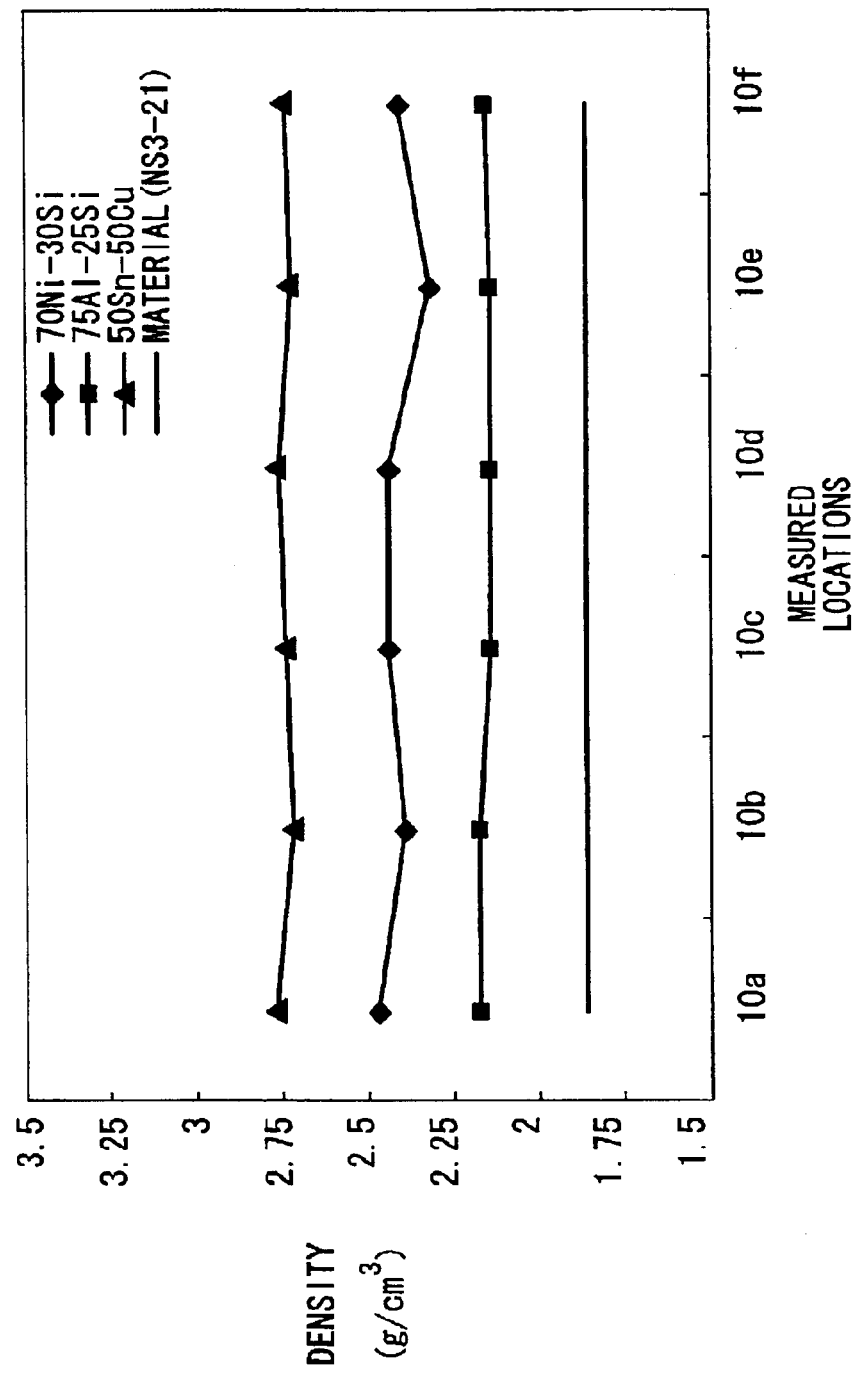
FIG. 10 is a graph showing densities in infiltrated regions in the heat sink material shown in FIG. 9.
Figure 11:
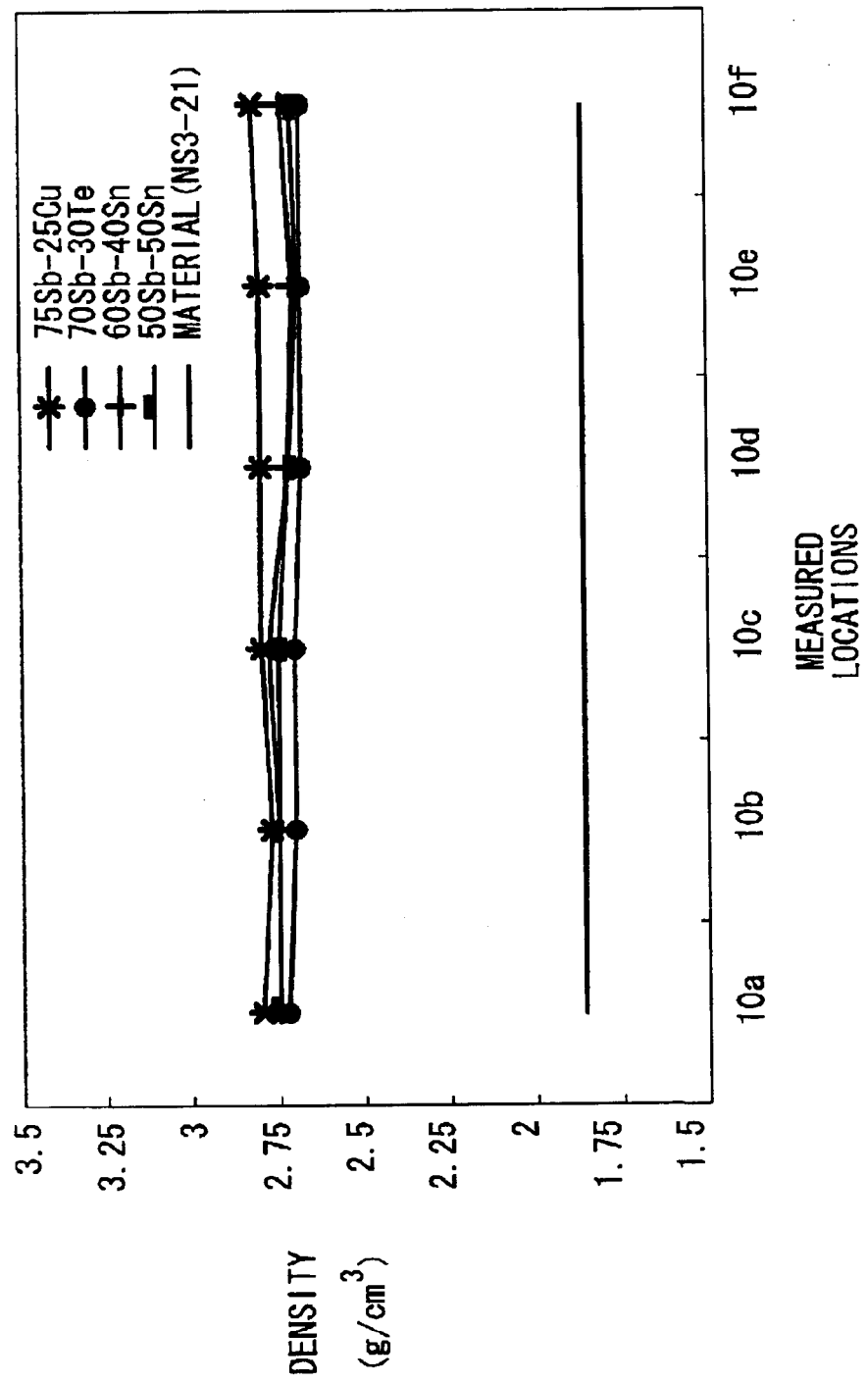
FIG. 11 is a graph showing densities in infiltrated regions in the heat sink material shown in FIG. 9.
Figure 12:
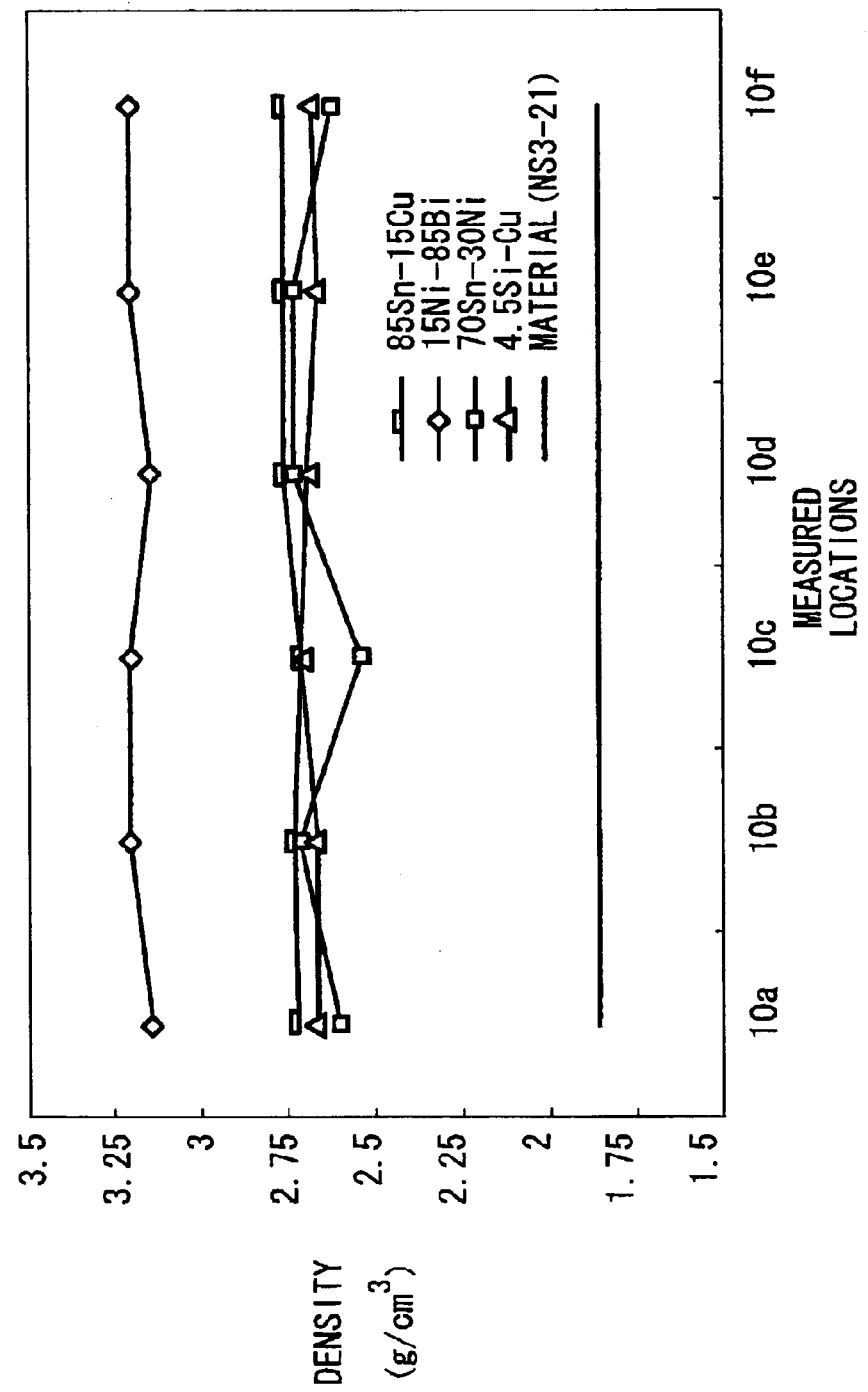
FIG. 12 is a graph showing densities in infiltrated regions in the heat sink material shown in FIG. 9.
Figure 13:
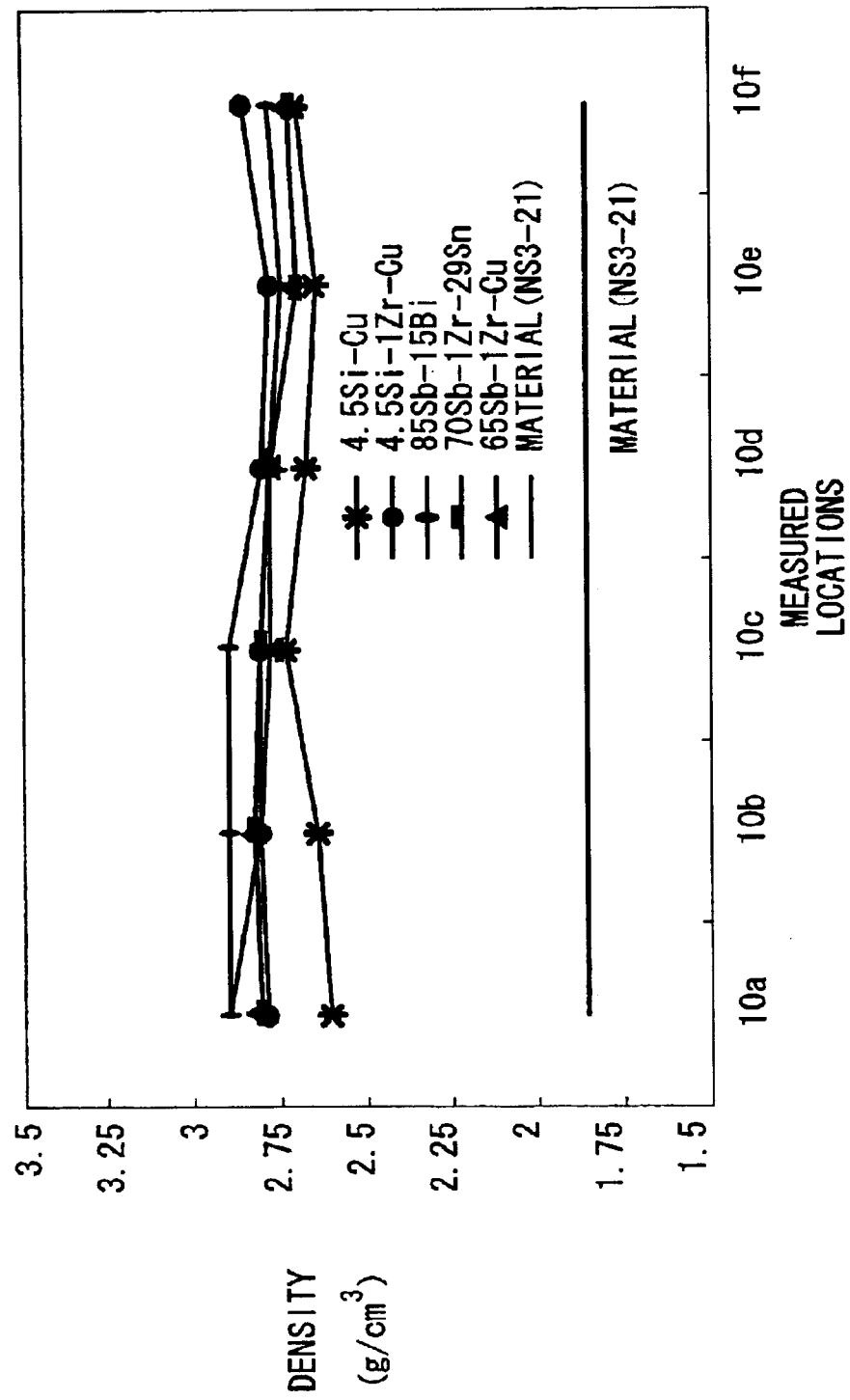
FIG. 13 is a graph showing densities in infiltrated regions in the heat sink material shown in FIG. 9.
Figure 18:
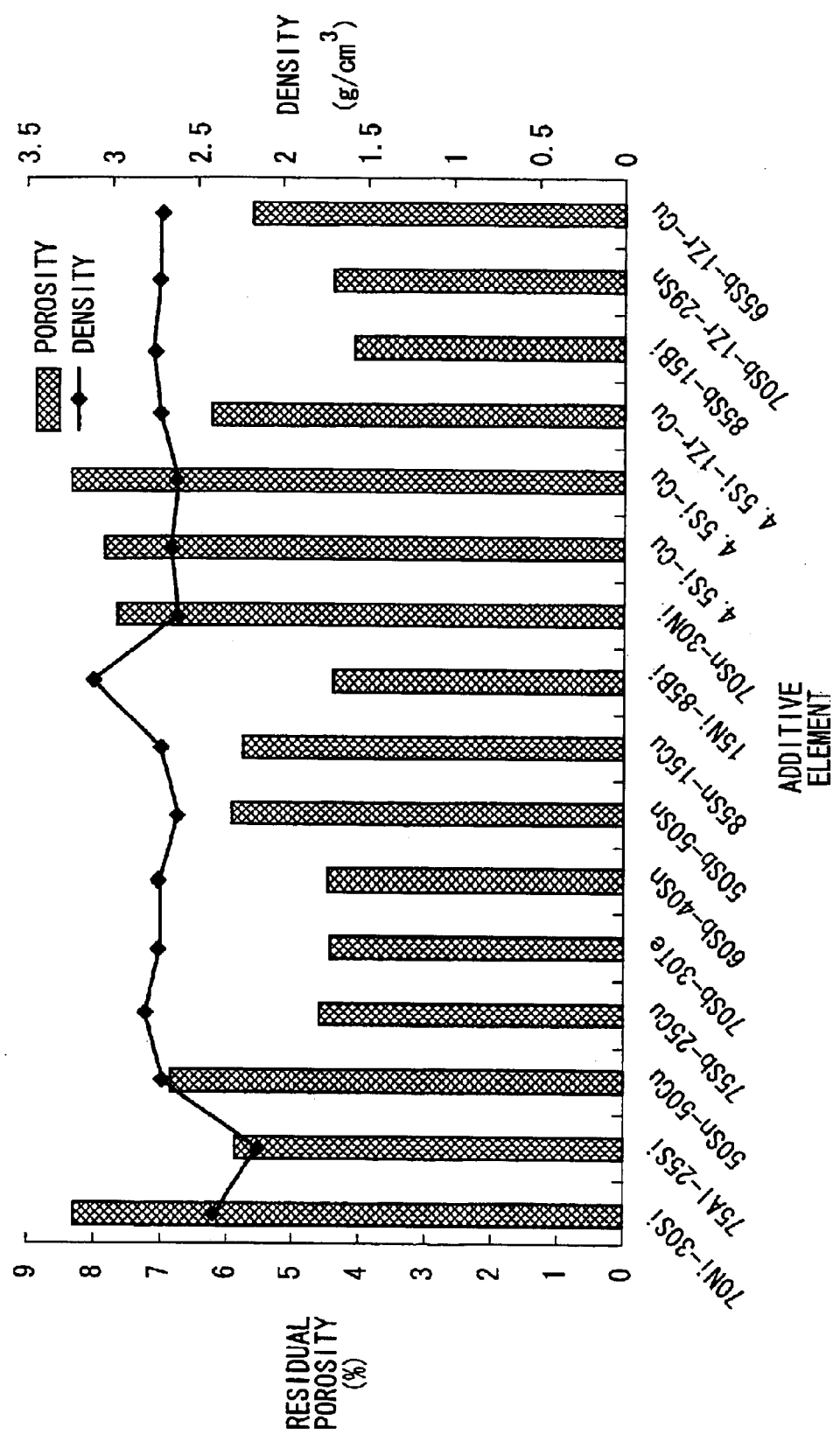
FIG. 18 is a graph showing porosities and densities of heat sink materials manufactured by the second manufacturing process.
Figure 19:
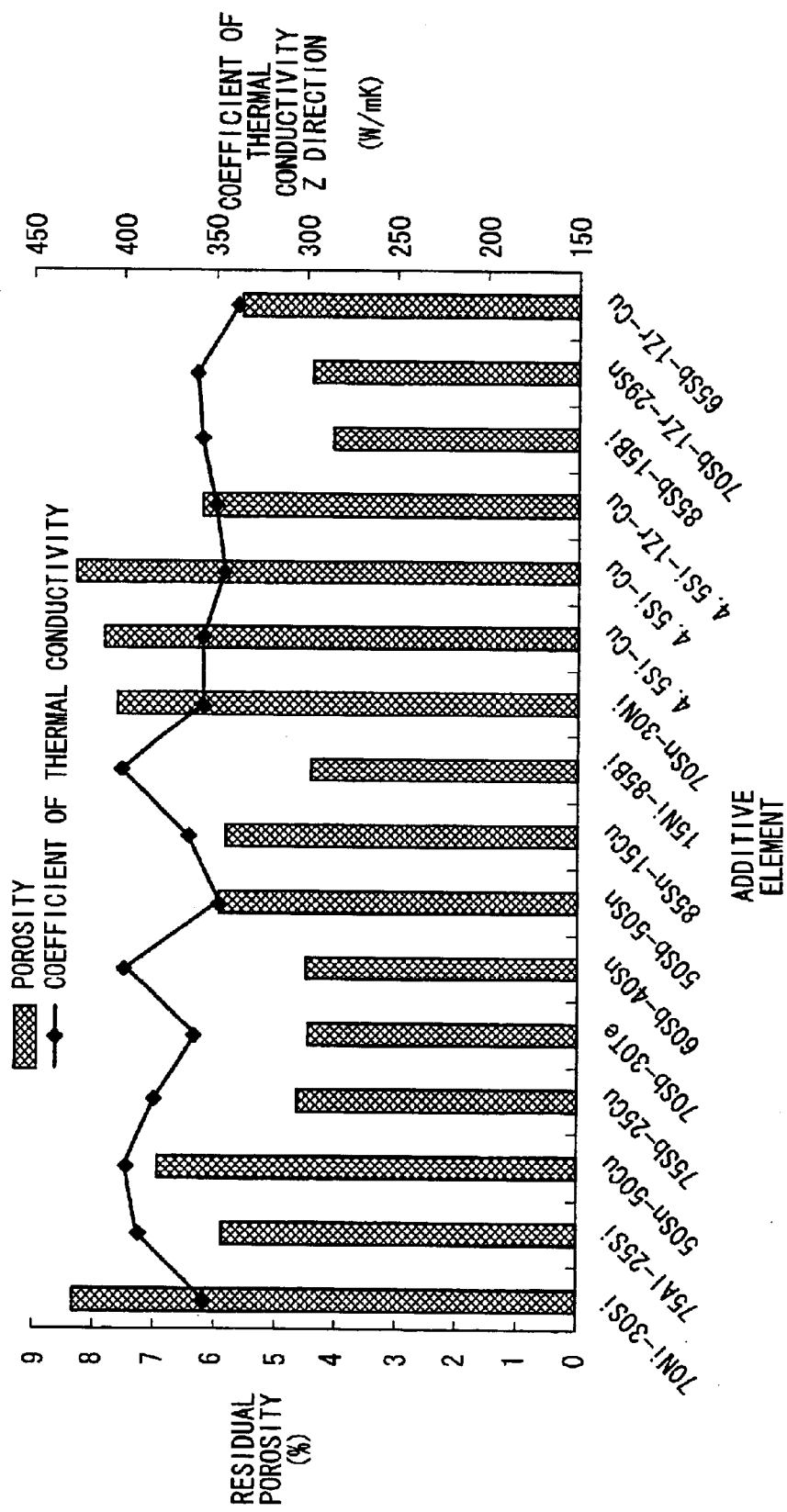
FIG. 19 is a graph showing densities and coefficients of thermal conductivity of heat sink materials manufactured by the second manufacturing process.

FIG. 9 is a cross-sectional view, taken along line IX—IX of FIG. 1, of the heat sink material 10A manufactured by the second manufacturing process. The different densities of the heat sink material 10A were measured at six divided infiltrated locations 10a through 10f in the heat sink material 10A.

FIGS. 10 through 13 show densities of the heat sink material 10A at the infiltrated locations 10a through 10f. The heat sink material 10A had six types (75Sb-25Cu, 70Sb-30Te, 60Sb-40Sn, 15Ni-85Bi, 85Sb-15Bi, 70Sb-1Zr-29Sn) produced by adding the above additive elements, and three types of the heat sink material 10A (70Ni-30Si, 75Al-25Si, 50Sn-50Cu) other than the six types were produced according to the conventional process. A material (NS3-21) was graphite serving as the matrix of the heat sink material 10A. It can be seen that almost no variations in the density of the heat sink material 10 are produced by adding the additive elements to the metal 14, suggesting that the infiltrated locations 10a through 10f were infiltrated by the same amount of metal 14 and had the same porosity.

FIGS. 14 through 20 show different coefficients of thermal conductivity, different coefficients of thermal expansion, and different porosities after the infiltration, in the examples in the above experiment and four types of the heat sink material 10A (95Sb-5Cu, 95Sb-5Bi, 95Sb-5Sn, 95Sb-5Te).

The types of the heat sink material 10A which were infiltrated by the additive elements Sb, Sn, Bi had densities and coefficients of thermal conductivity which were not different from a conventional heat sink material which were infiltrated by pure aluminum, pure copper, and pure nickel. This is because the addition of the additive elements improved the wettability at the interface between the carbon and the metal 14, increasing close contact between the carbon and the metal 14.

It has been confirmed that the porosities of all carbon types which were infiltrated by the additive elements were lower than those which were infiltrated by pure copper, pure copper alloy, and pure aluminum. This is also because the addition of the additive elements improved the wettability at the interface between the carbon and the metal 14, increasing close contact between the carbon and the metal 14.

In each of the above samples, the ratio of the coefficient of thermal conductivity in the direction of the plane to the coefficient of thermal conductivity in the direction of the thickness is 1:5 or less, exhibiting properties nearly equal to isotropic properties. Therefore, when each sample is to be used as a heat sink, a practical advantage is offered because no consideration is to be given to the direction in which to install the heat sink.

FIG. 21 shows densities of different types of the heat sink material 10A manufactured under a higher infiltrating pressure than in the above experiment, and porosities, after the infiltration, thereof. One of the types of the heat sink material 10A (95Sb-5Cu) was manufactured by the first manufacturing process, and the other type of the heat sink material 10A (4.5Si-95.5 Cu) was manufactured by the conventional process.

It can be seen from FIG. 20 that the types of the heat sink material 10A manufactured under the increased infiltrating pressure had residual porosities lower than those of the samples shown in FIG. 20. However, a comparison between the density of the heat sink material 10A manufactured by the first manufacturing process and the densities of the types of the heat sink material 10A manufactured under the lower infiltrating pressure shown in FIGS. 10 through 20 indicates that the increase in the infiltrating pressure does not essentially affect the density and the residual porosity after the infiltration. Rather, it is to be noted as shown in FIG. 21 that a large reduction in the residual porosity is achieved by changing infiltrating metals. Stated otherwise, an effect produced by changing infiltrating metals is more significant than an effect produced by increasing the infiltrating pressure. Therefore, the heat sink material 10A infiltrated by additive elements has a desired porosity and density even if it is manufactured under a low infiltrating pressure.

A heat sink material 10B according to a second embodiment of the present invention will be described below with reference to FIG. 22.

Figure 22:
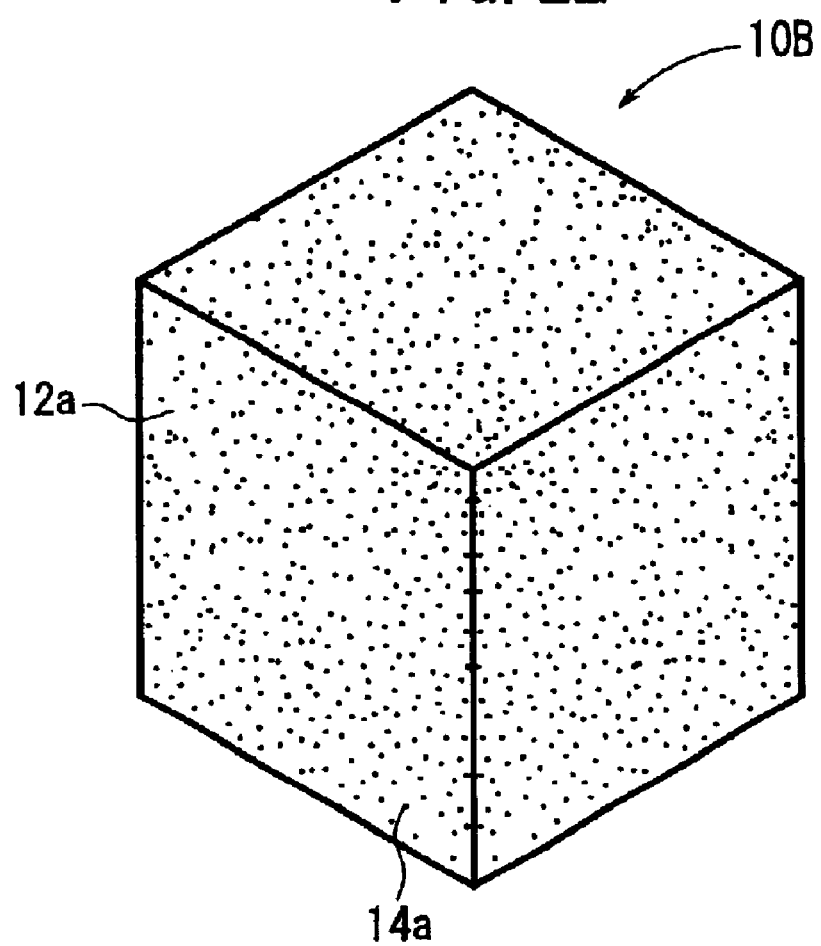
FIG. 22 is a perspective view showing a structure of a heat sink material according to a second embodiment of the present invention.

As shown in FIG. 22, the heat sink material 10B according to the second embodiment is produced by mixing a powder 12a of carbon or an allotrope thereof with a powder 14a of metal 14, and forming the mixture at a predetermined temperature under a predetermined pressure.

The carbon or an allotrope thereof should have a coefficient of thermal conductivity of 150 W/mK or higher, preferably a coefficient of thermal conductivity of 200 W/mK or higher (an estimated value with no pores), more preferably a coefficient of thermal conductivity of 250 W/mK or higher (an estimated value with no pores), or much more preferably a coefficient of thermal conductivity of 300 W/mK or higher (an estimated value with no pores). In the second embodiment, diamond may be used instead of graphite as the carbon. In the second embodiment, a powder of graphite having a coefficient of thermal conductivity of 100 W/mK or higher and a powder of copper are mixed with each other, and the mixture is formed into the heat sink material 10B. The metal 14 should preferably comprise a metal having a property of expansion upon solidification or a metal having a property of inhibiting a solidification shrinkage, and may be Bi or a metal selected from Sb, Ga and graphite cast iron, or an alloy containing at least one of these metals.

Alternatively, the heat sink material 10B according to the second embodiment may be manufactured by mixing a crushed and torn material of carbon or an allotrope thereof (e.g., a crushed and torn material of carbon fiber) and a powder 14a of metal 14 with each other, and forming the mixture at a predetermined temperature under a predetermined pressure.

The predetermined temperature should preferably be 10° C. to 50° C. lower than the melting point of the metal 14 in view of the forming process in a press, and the predetermined pressure should preferably be in the range from 10.13 MPa to 101.32 MPa (100 atmospheric pressures to 1000 atmospheric pressures).

The powder 12a of carbon or an allotrope thereof and the powder 14a of the metal 14 should preferably have an average powder particle size ranging from 1 μm to 500 μm. The volume ratio of the carbon or an allotrope thereof ranges from 20 vol. % to 80 vol. %, and the volume ratio of the metal 14 ranges from 80 vol. % to 20 vol. %. The heat sink material 10B thus manufactured has a coefficient of thermal conductivity of 300 W/mK or higher either on the average in the directions of three orthogonal axes or in the direction of any one of the three orthogonal axes, and a residual porosity of 5% or less.

In the heat sink material 10A according to the second embodiment, an additive for making it possible to resinter the formed mixture should preferably be added to the carbon or an allotrope thereof. The additive may be SiC and/or Si. The addition of the additive allows the formed mixture to be resintered at a temperature equal to or higher than the melting point of the metal 14. Since particles produced after the mixture is formed are joined together by the resintering step, almost all grain boundary which would impair the thermal conductivity can be eliminated, increasing the thermal conductivity of the heat sink material 10B.

An additive element for reacting with the carbon or an allotrope thereof may be added to the powder 12a of carbon or an allotrope thereof. The additive element may be at least one material selected from Ti, W, Mo, Nb, Cr, V, Zr, Be, Al, Ta, Mn, Si, Fe, Co, Ni, Mg, Ca, B, and mish metal. The added additive element produces a reaction layer (carbide layer) on the surface of the carbon or an allotrope thereof when the mixture is formed or resintered, increasing the bonding strength between the particles on the surface of the heat sink material 10B.

The metal 14 should preferably comprise a metal having a property of expansion upon solidification or a metal having a property of inhibiting a solidification shrinkage, and may be a metal selected from Bi, Sb, Ga and graphite cast iron, or an alloy containing at least one of these metals. The metal 14 thus selected improves the wettability of the interface between the carbon or an allotrope thereof and the metal 14, and suppresses a reduction in the shrinkage caused when the metal 14 is cooled to the room temperature, making it possible to reduce the porosity of the heat sink material 10B.

It is also preferable to add, to the metal 14, at least one metal having a low melting point selected from Nb, Zr, Cr, and Be which forms a solid solution with copper only at a weight ratio of 0.5 wt. % or less. The addition of the above metal can increase the bonding strength between the particles of the metal 14 when the mixture is formed.

Several processes (third and fourth manufacturing processes) for manufacturing the heat sink material 10B according to the second embodiment will be described below with reference to FIGS. 23 through 27.

Figure 23:
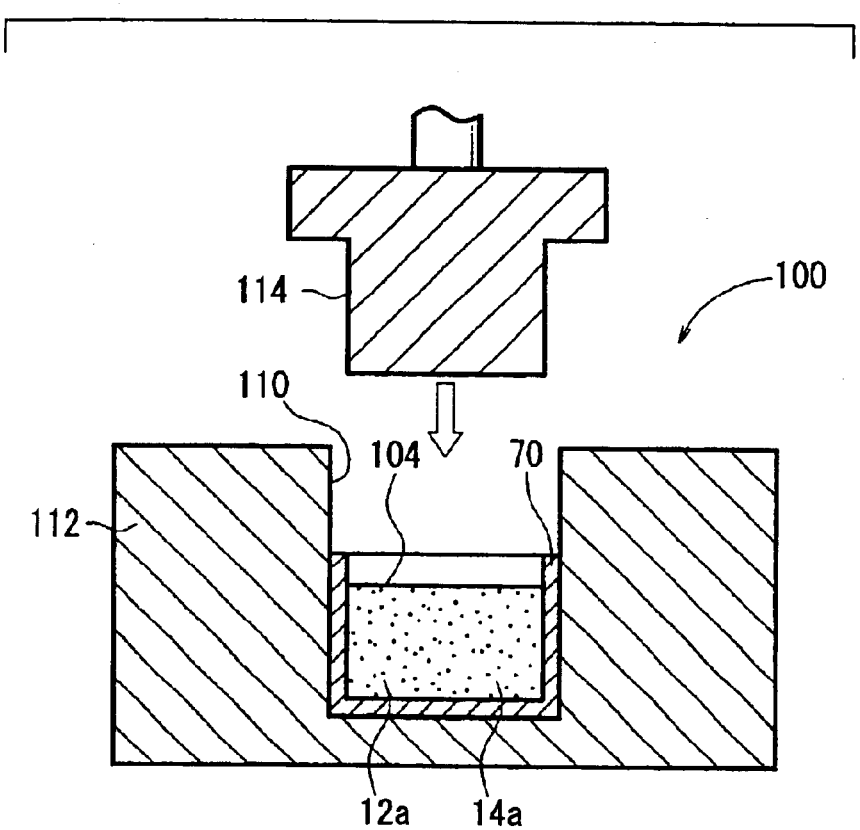
FIG. 23 is a cross-sectional view of a preforming machine for use in a third manufacturing process.
Figure 24:
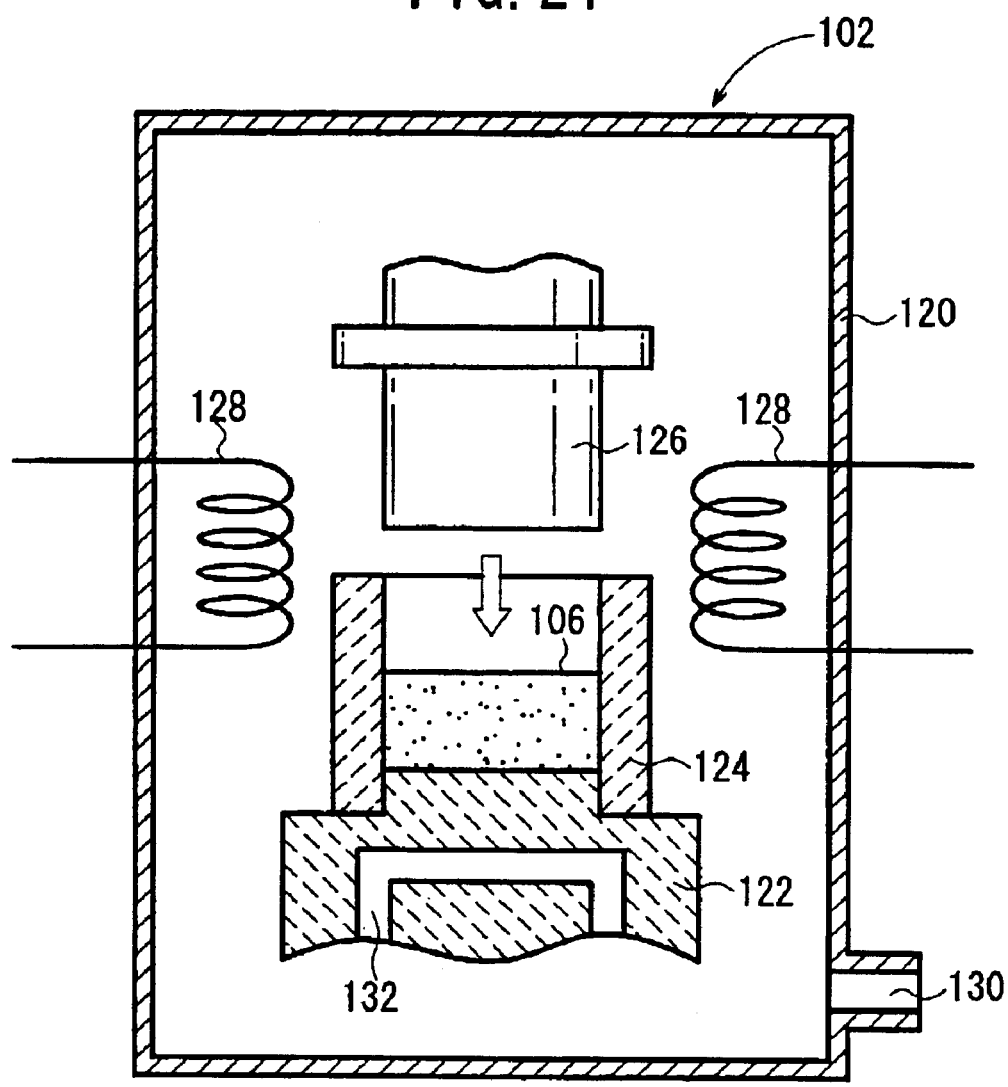
FIG. 24 is a cross-sectional view of a hot press for use in the third manufacturing process.

As shown in FIGS. 23 and 24, a third manufacturing process uses a preforming machine 100 (see FIG. 23) and a hot press 102 (see FIG. 24).

As shown in FIG. 23, the preforming machine 100 has a mold 112 having an upwardly open cavity 110, and a punch 114 insertable into the cavity 110 for pressing a content in the cavity 110. A case 70 to be placed in the cavity 110 accommodates therein a mixture 104 of a powder 12a of carbon or an allotrope thereof with a powder 14a of metal 14.

As shown in FIG. 24, the hot press 102 comprises a tubular housing 120, a lower punch 122 disposed in the housing 120 and serving as a base, an upwardly open refractory casing 124 of graphite disposed in the housing 120 and fixedly mounted on the lower punch 122, an upper punch 126 disposed above the refractory casing 124 in the housing 120 and movable into and out of the refractory casing 124, and a heater 128 disposed in the housing 120 for heating the refractory casing 124. The refractory casing 124 accommodates therein a preformed body 106 of the mixture 104 which has been formed by the preforming machine 100. The hot press 102 has a suction pipe 130 for evacuating the housing 120.

The lower punch 122 has a passage 132 defined therein for passing therethrough a heating fluid for heating the refractory casing 124 and a cooling fluid for cooling the refractory casing 124.

Figure 25:
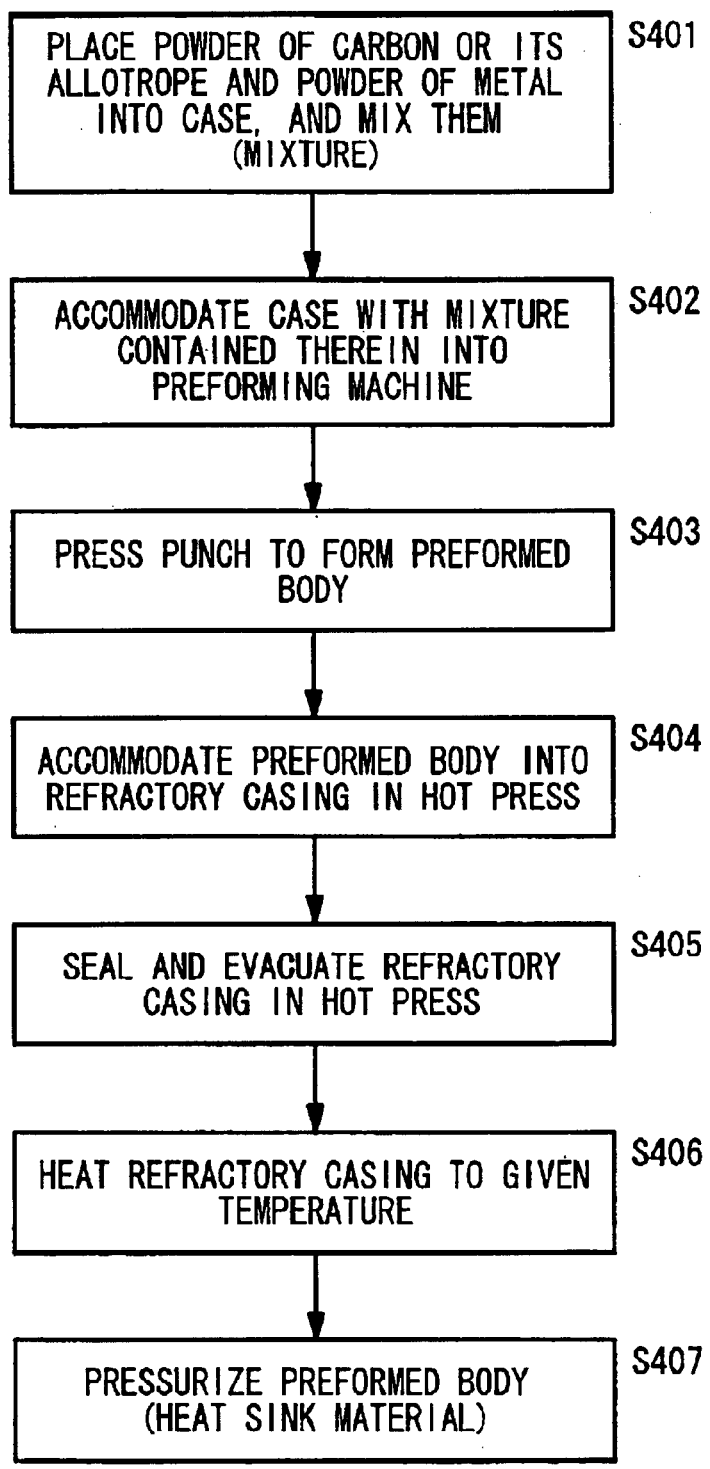
FIG. 25 is a flowchart of the third manufacturing process.

The third manufacturing process has a succession of steps to be carried out as shown in FIG. 25. A powder 12a of carbon or an allotrope thereof with a powder 14a of metal 14 are placed in the case 70, and mixed to obtain a mixture 104 in step S401. Then, the case 70 with the mixture 104 contained therein is put into the cavity 110 in the mold 112 of the preforming machine 100 in step S402. Thereafter, the punch 114 is pressed into the cavity 110, preforming the mixture 104 into a preformed body 106 in step S403.

Then, the preformed body 106 is removed from the mold 112, and placed in the refractory casing 124 in the hot press 102 in step S404. After the refractory casing 124 is sealed, the refractory casing 124 is evacuated through the suction pipe 130, developing a negative pressure therein in step S405. Thereafter, the heater 128 is energized to increase the temperature in the refractory casing 124 to a temperature which is 10° C. to 50° C. lower than the melting point of the metal 14 in step S406.

When the temperature in the refractory casing 124 has reached the desired temperature, the upper punch 126 is lowered to press the preformed body 106 into the heat sink material 10B in step S407. Thereafter, the heat sink material 10B is machined for use as an actual heat sink material 10B. If an element for increasing the bonding strength between the carbon or an allotrope thereof and the metal 14 is added, then the heat sink material 10B produced after the preformed body 106 is pressed may be heated to a temperature equal to or higher than the melting point of the metal 14.

Preferred additive elements to be added to the carbon or an allotrope thereof and preferred additive elements to be added to the metal 14 have been described above, and will be described in detail below.

The heat sink material 10B manufactured by the above steps of the third manufacturing process has a coefficient of thermal conductivity of 300 W/mK or higher either on the average in the directions of three orthogonal axes or in the direction of any one of the three orthogonal axes, and a residual porosity of 5% or less.

A fourth manufacturing process will be described below with reference to FIGS. 26 and 27. According to the fourth manufacturing process, the preforming machine 100 shown in FIG. 23 is not used, but only a hot press 102 shown in FIG. 27 is used.

Figure 26:
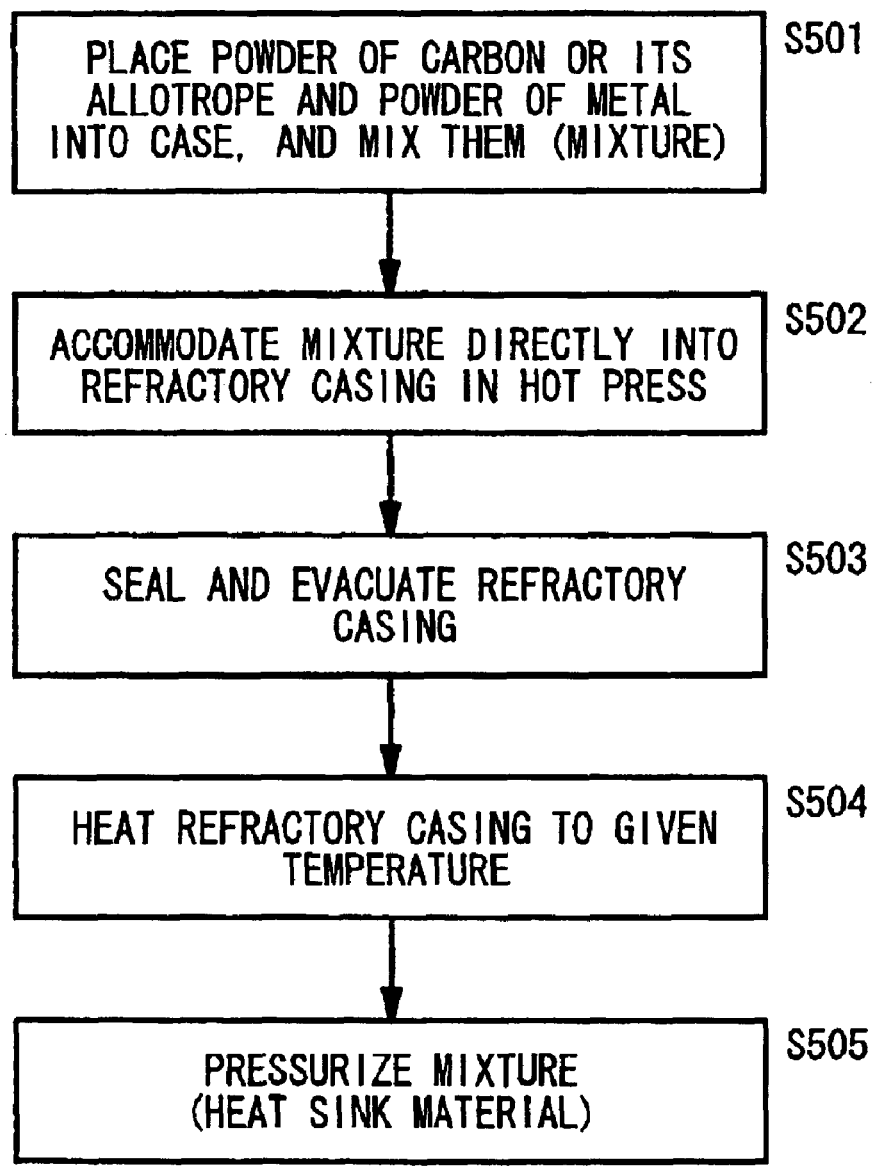
FIG. 26 is a flowchart of a fourth manufacturing process.
Figure 27:
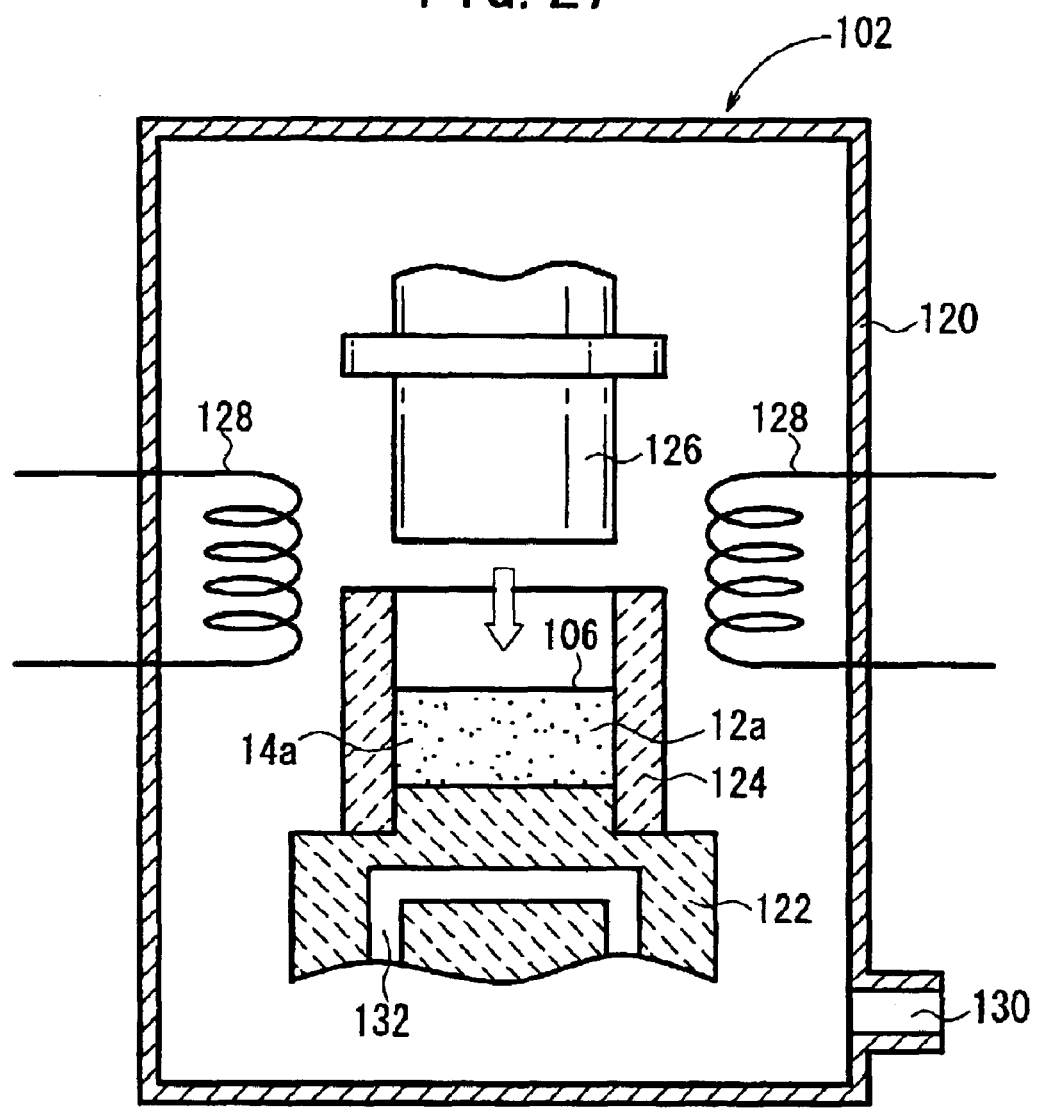
FIG. 27 is a cross-sectional view of a hot press for use in the fourth manufacturing process.

As shown in FIGS. 26 and 27, a powder 12a of carbon or an allotrope thereof with a powder 14a of metal 14 are placed in the case 70, and mixed to obtain a mixture 104 in step S501. Then, the case 70 with the mixture 104 contained therein is directly put into the refractory casing 124 in the hot press 102 in step S502. After the refractory casing 124 is sealed, the refractory casing 124 is evacuated through the suction pipe 130, developing a negative pressure therein in step S503. Thereafter, the heater 128 is energized to increase the temperature in the refractory casing 124 to a temperature which is 10° C. to 50° C. lower than the melting point of the metal 14 in step S504.

When the temperature in the refractory casing 124 has reached the desired temperature, the upper punch 126 is lowered to press the mixture 104 into the heat sink material 10B in step S505.

The heat sink material 10B produced by the fourth manufacturing process has a coefficient of thermal conductivity of 300 W/mK or higher either on the average in the directions of three orthogonal axes or in the direction of any one of the three orthogonal axes, and a residual porosity of 5% or less.

A heat sink material 10C according to a third embodiment of the present invention will be described below with reference to FIG. 28.

Figure 28:
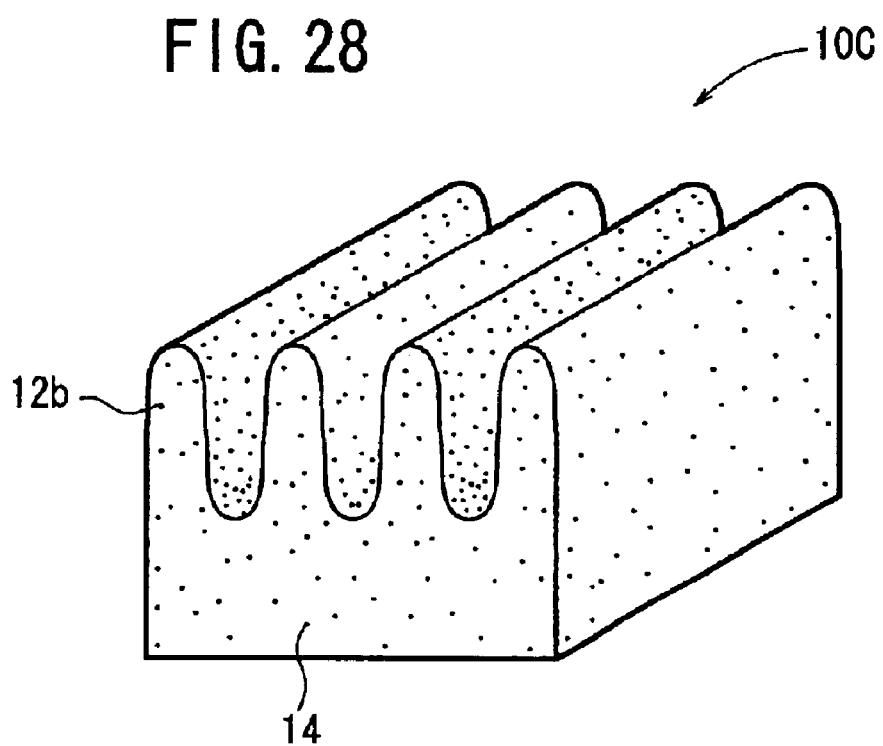
FIG. 28 is a perspective view showing a structure of a heat sink material according to a third embodiment of the present invention.

As shown in FIG. 28, the heat sink material 10C according to the third embodiment is produced by pressing a mixture of a powder 12b of carbon or an allotrope thereof and a binder into a preformed body and then a block which may be shaped as a cube, a rectangular parallelepiped, or any other shape, and then infiltrating a metal 14 into the block. The powder 12b may be the same as the powder 12a of carbon or an allotrope thereof according to the second embodiment. The heat sink material 10C may be formed into any shape close to a final shape.

The carbon or an allotrope thereof may comprise graphite or diamond. The metal 14 may comprise Bi or a metal selected from Sb, Ga and graphite cast iron, or an alloy containing at least one of these metals.

The powder 12b of carbon or an allotrope thereof should preferably have an average powder particle size ranging from 1 $\mu$m to 500 $\mu$m. The average ratio of minimum and maximum lengths of the particles of the powder 12b should preferably be 1:5 or less between a direction in which said particle has said minimum length and a direction in which said particle has said maximum length. Though the heat sink material 10C thus constructed has no strong network therein, it can be formed into any shape close to a final shape. Therefore, any subsequent machining step for the heat sink material 10C may be dispensed with. The volume ratio of the carbon or an allotrope thereof ranges from 20 vol. % to 80 vol. %, and the volume ratio of the metal 14 ranges from 80 vol. % to 20 vol. %.

An additive element for reacting with the carbon or an allotrope thereof may be added to the powder 12b of carbon or an allotrope thereof. The additive element may be selected in the same manner as with the second embodiment.

Various additive elements should preferably be added to the metal 14, as with the first embodiment. Those additive elements include additive elements for improving wettability, additive elements for increasing the reactivity between the carbon or an allotrope thereof and the metal 14, and additive elements for lowering the melting point.

Figure 29:
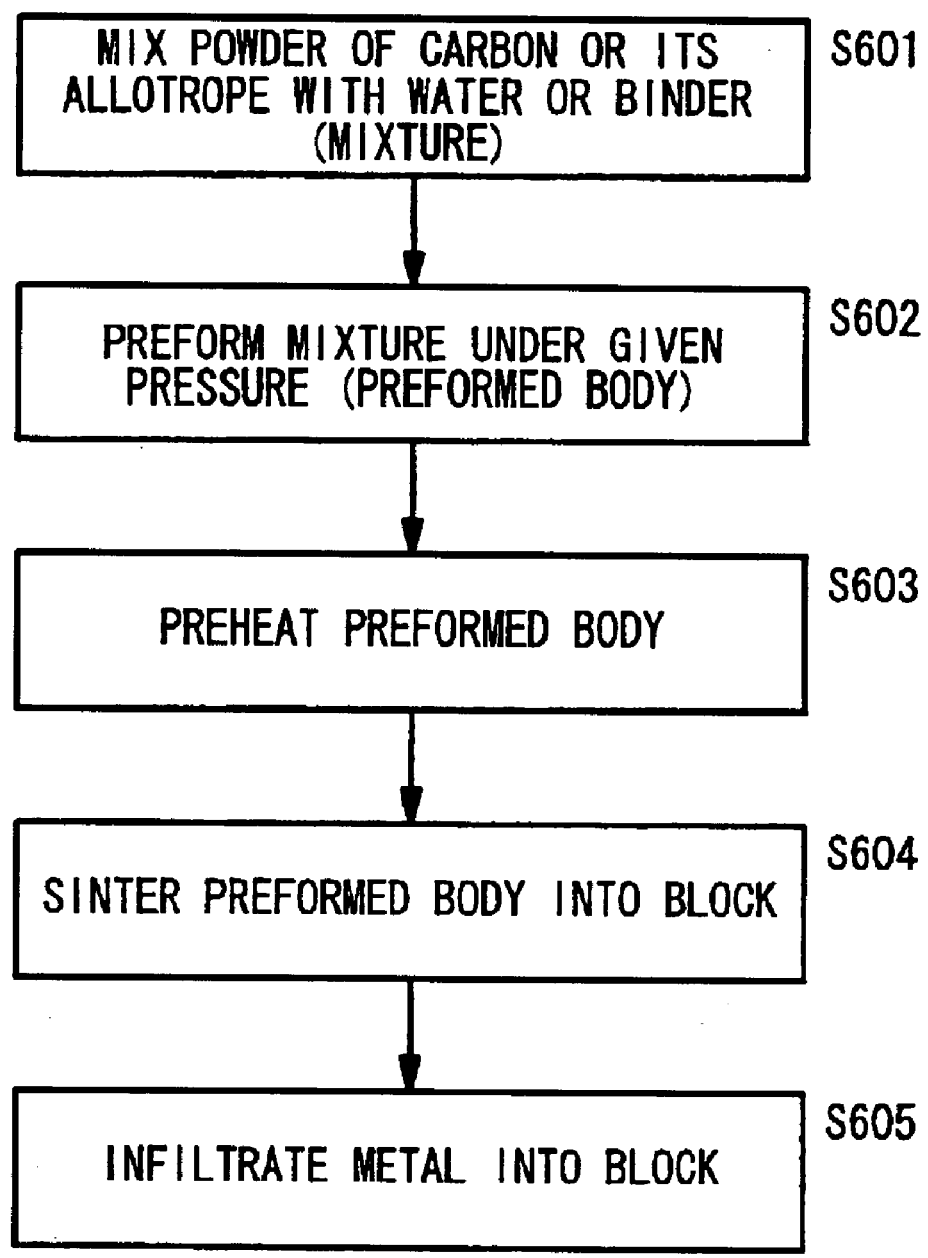
FIG. 29 is a flowchart of a fifth manufacturing process.

A fifth manufacturing process for manufacturing the heat sink material 10C according to the third embodiment will be described below with reference to FIG. 29. According to the fifth manufacturing process, a mixture is prepared by mixing a powder 12b of carbon or an allotrope thereof with water or a binder in step S601.

The mixture is then pressed into a preformed body (not shown) under a predetermined pressure in step S602. The mixture may be pressed by the press 62 (see FIG. 7) or the preforming machine 100 (see FIG. 23).

Then, the preformed body is preheated to facilitate the infiltration thereof with the molten metal 14 in step S603. If the molten metal 14 has a temperature of about 1200° C., then the graphite should preferably be preheated to a temperature ranging from 1000° C. to 1400° C. With the preheating step, the binder used in step S601 may be dispensed with.

In step S604, the preformed body is sintered into a block by the same sintering process as with the first embodiment.

The block is then infiltrated by the molten metal in step S605. The block may be infiltrated by the same sintering process as with the first embodiment. For example, the high-pressure vessel 30 (see FIG. 2) may be used, and steps S2 through S9 of the first manufacturing process (see FIG. 3) may be carried out to produce the heat sink material 10C.

According to the fifth manufacturing process, the coefficient of thermal expansion and the coefficient of thermal conductivity may be controlled at desired values depending on the compression of the powders in the pressing process in step S602.

The produced heat sink material 10C has its thermal conductivity made more isotropic and has its wettability and material yield increased.

Since a network is produced by the metal 14, the residual pores in the heat sink material 10C are reduced.

The heat sink material 10C can be manufactured inexpensively. Specifically, the block before it is infiltrated cannot be machined as it is too brittle. However, since the preformed body can be infiltrated after it is formed into a final shape, and can withstand subsequent forces tending to cause certain plastic deformations, the heat sink material 10C which may be complex in shape can be manufactured inexpensively.

In the fifth manufacturing process, as with the various previous manufacturing processes, an element for forming a carbide may be added to the metal 14 to lower the coefficient of thermal expansion, and an element for improving the wettability may be added to increase the rate of infiltration.

A higher infiltrating pressure is effective to increase the rate of infiltration, the mechanical strength, and the coefficient of thermal conductivity.

Figure 30:
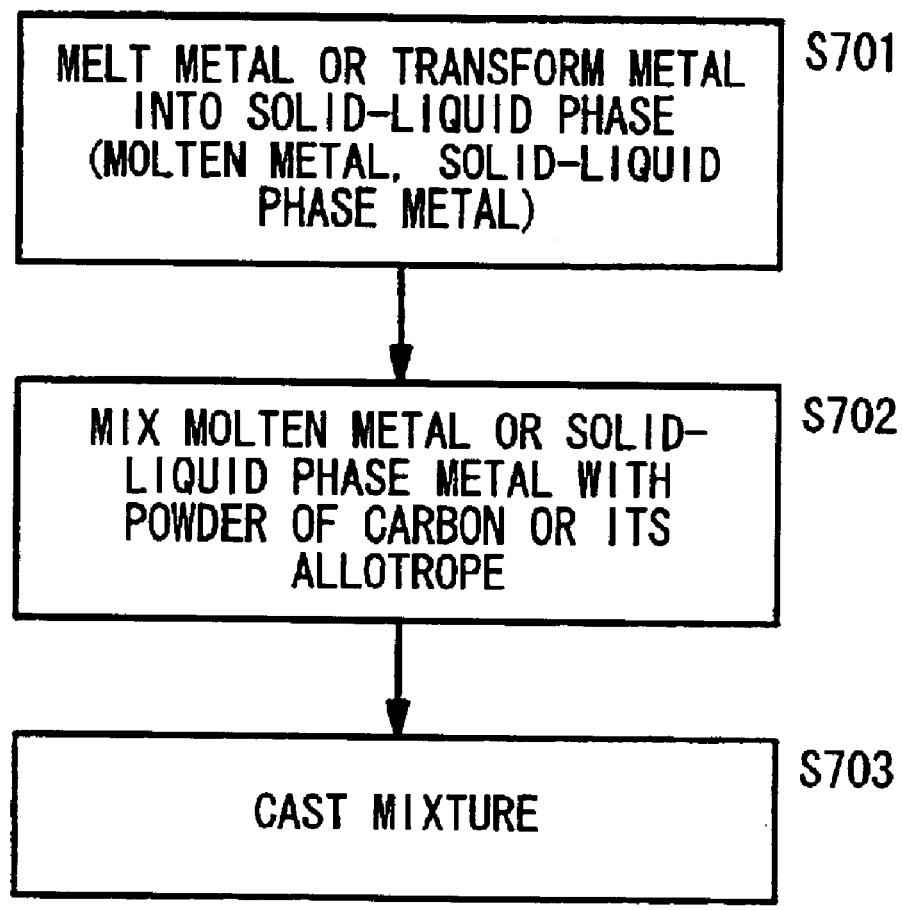
FIG. 30 is a flowchart of a sixth manufacturing process.

A sixth manufacturing process for manufacturing the heat sink material 10C according to the third embodiment will be described below with reference to FIG. 30. According to the sixth manufacturing process, a molten metal or a metal in a solid-liquid phase (solid-liquid phase metal) is prepared in step S701. The solid-liquid phase metal is a metal (generally, an alloy) which is melted into a partly molten state or a molten metal which is cooled and stirred into a partly solidified state, and refers to both a metal directly heated into a partly molten state and a metal fully melted and then cooled into a partly solidified state.

A power 12b of carbon or an allotrope thereof is mixed with the molten metal 14 or the solid-liquid phase metal in step S702.

The molten metal 14 or the solid-liquid phase metal with which the powder 12b is mixed is then cast, and the cast product is formed into the heat sink material 10C in step S073.

The heat sink material 10C produced according to the sixth manufacturing process has the same features as those of the heat sink material produced according to the fifth manufacturing process.

A seventh manufacturing process for manufacturing the heat sink material 10 will be described below with reference to FIGS. 31 through 34.

Figure 31:
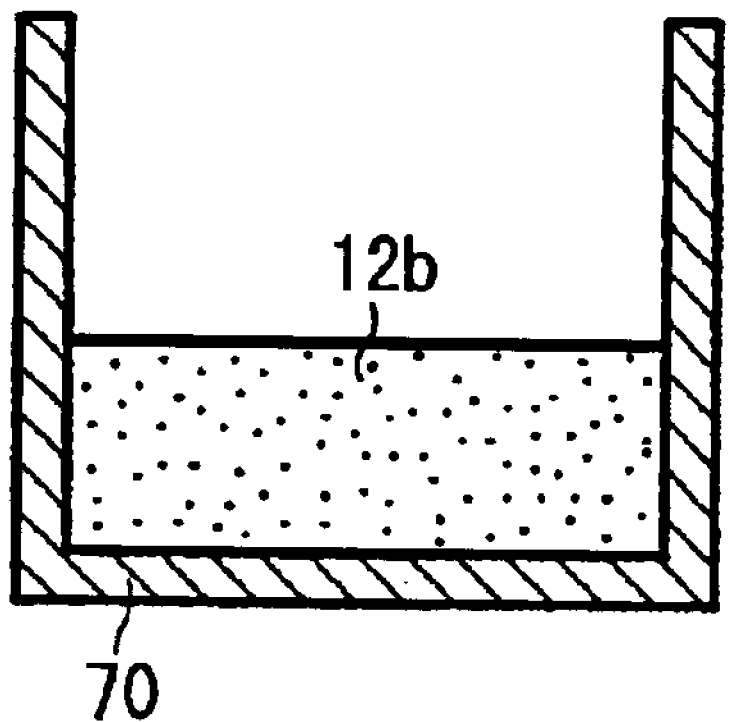
FIG. 31 is a cross-sectional view showing a case with a powder placed therein in a seventh manufacturing process.
Figure 32:
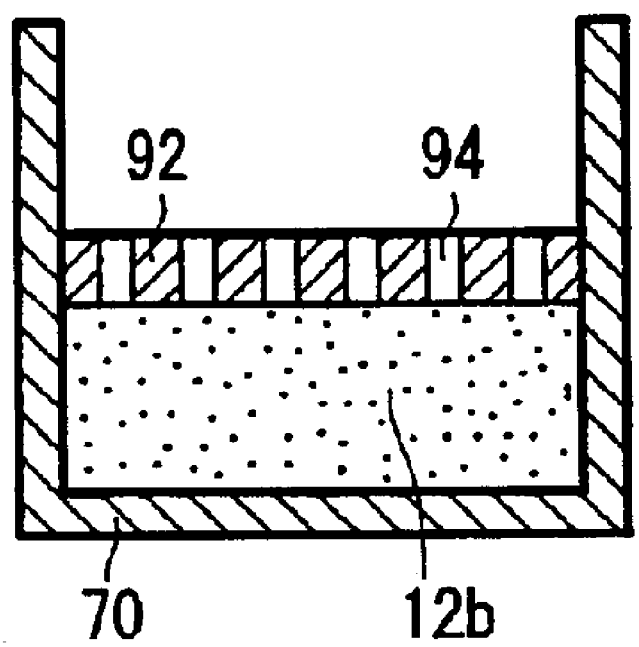
FIG. 32 is a cross-sectional view showing the case with a lid placed on the powder in the case in the seventh manufacturing process.

According to the seventh manufacturing process, as shown in FIG. 31, a powder 12b of carbon or an allotrope thereof is placed in a case 70 made of graphite, ceramics, or cerapaper, or as shown in FIG. 32, a plate-like lid 92 of carbon (which has holes 94 defined therein or which is porous for allowing a molten metal to pass therethrough) is put on the powder 12b to prevent the powder 12b from rising. Then, the case 70 with the powder 12b contained therein is preheated and then infiltrated by metal.

Figure 33:
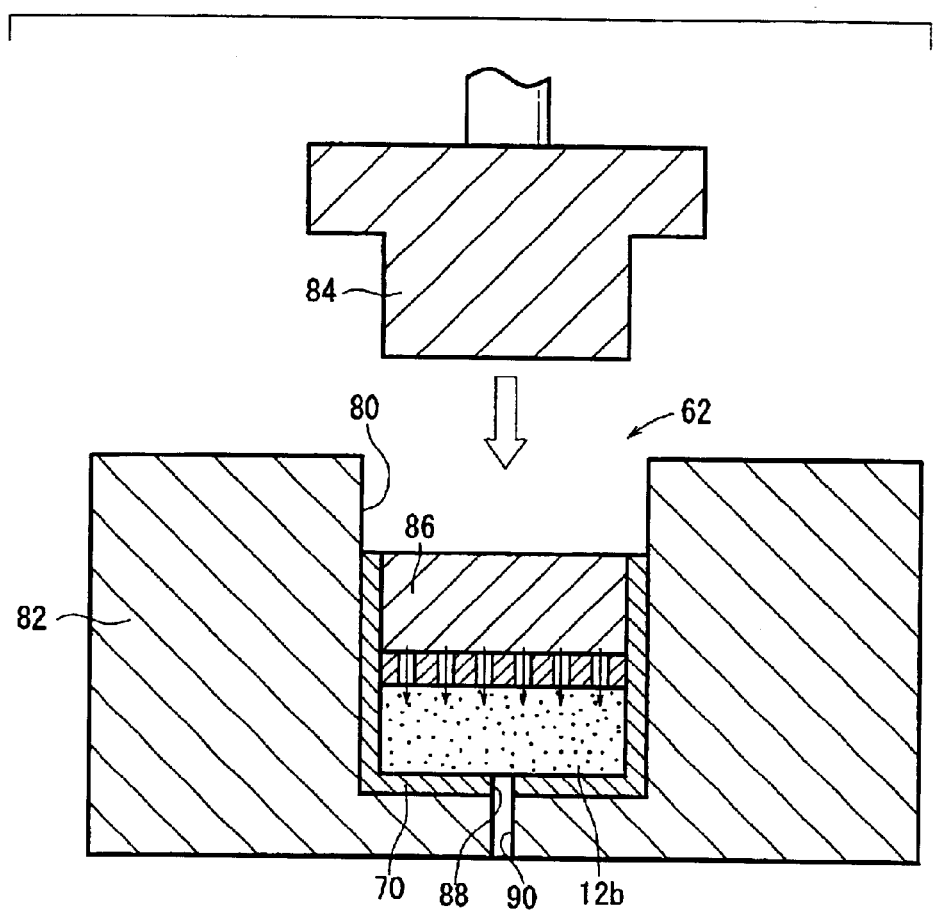
FIG. 33 is a cross-sectional view showing the case with a molten metal poured therein and depressed by a punch the seventh manufacturing process.
Figure 34:
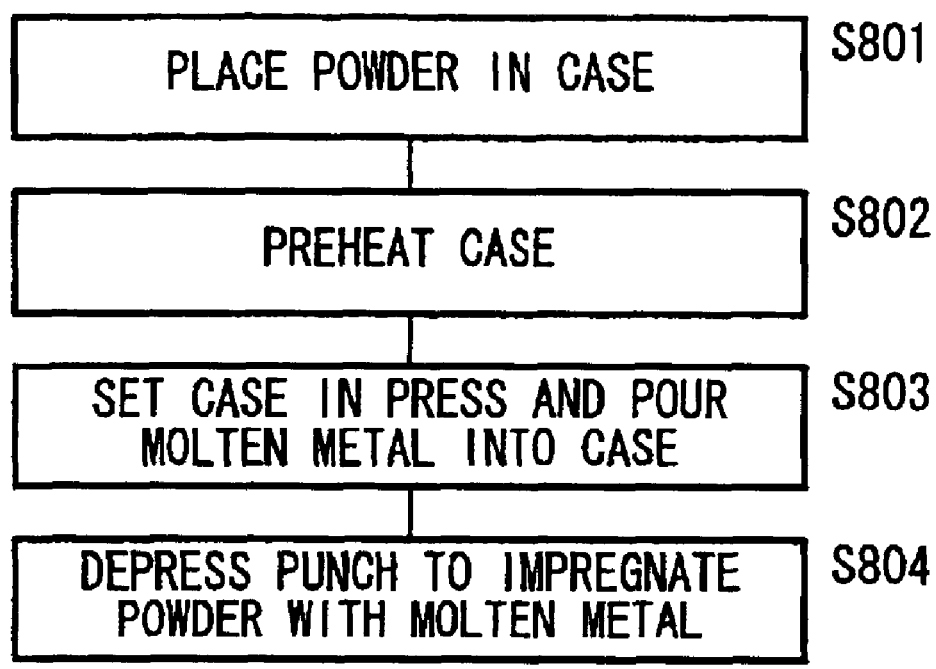
FIG. 34 is a flowchart of the seventh manufacturing process.

Specifically, as shown in FIG. 31, the powder 12b is placed in the case 70 in step S801 shown in FIG. 34. Then, as shown in FIG. 32, the lid 92 is placed on the powder 12b in the case 70, and the case 70 is preheated in step S802. Thereafter, as shown in FIG. 33, the case 70 with the powder 12b contained therein is placed into the cavity 80 in the press 62, and the molten metal 86 such as copper or the like is poured into the case 70 through the holes 94 in the lid 92 in step S803. The case 70 may be heated without the lid 92, or the molten metal 86 may be poured into the case 70 without the lid 92.

As shown in FIG. 33, the punch 84 is inserted into the cavity 80 with the lid 92 in the case 70, depressing the molten metal 86 in the case 70 into the powder 12b. Therefore, the power 12b is infiltrated by the molten metal 86.

The heat sink material 10C produced according to the seventh manufacturing process has the same features as those of the heat sink material produced according to the fifth manufacturing process.

An embodiment in which the porous sintered body 12 is made of SiC will be described below. If SiC is used in the first embodiment (the first manufacturing process, the first modification, the second modification, and the second manufacturing process), then the process of sintering graphite into the porous sintered body 12 (steps S1, S101, S201, S301, and S302) is not required, and the heat sink material can be manufactured in the same process as with the subsequent steps.

A manufacturing process (eighth manufacturing process) according to the fourth embodiment in which the porous sintered body 12 is made of SiC will be described below with reference to FIGS. 35 through 38.

Figure 35:
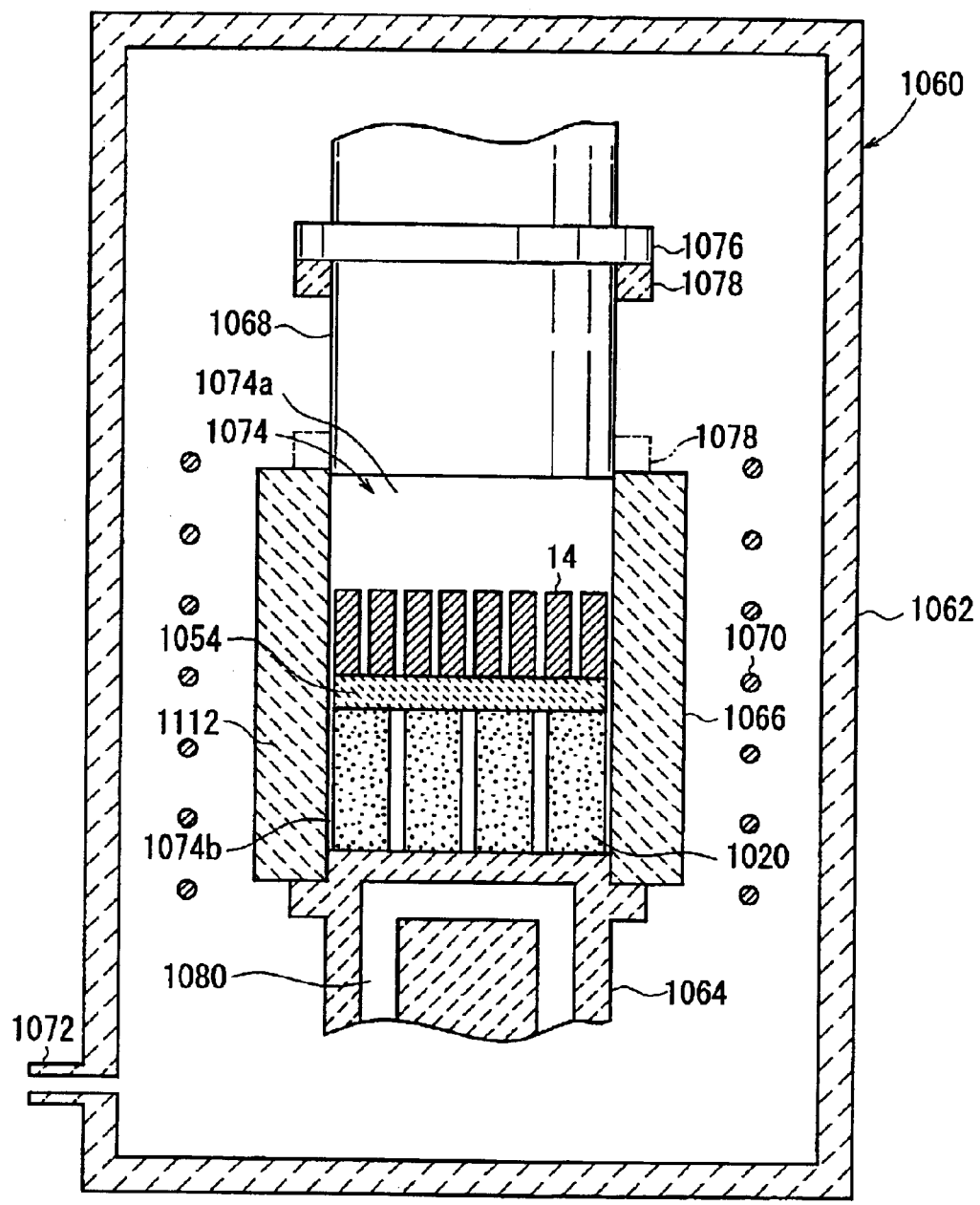
FIG. 35 is a cross-sectional view of a hot press for use in an eighth manufacturing process.

As shown in FIG. 35, the eighth manufacturing process is carried out using a hot press 1060. The hot press 1060 is structurally identical to the hot press 102 described above with respect to the second embodiment.

The hot press 1060 comprises a tubular housing 1062, a lower punch 1064 disposed in the housing 1062 and serving as a base, an upwardly open refractory casing 1066 of graphite disposed in the housing 1062 and fixedly mounted on the lower punch 1064, an upper punch 1068 disposed above the refractory casing 1066 in the housing 1062 and movable into and out of the refractory casing 1066, and a heater 1070 disposed in the housing 1062 for heating the refractory casing 1066. The hot press 1060 has a suction pipe 1072 for evacuating the housing 1062.

The refractory casing 1066 is of a tubular shape having a hollow space 1074 therein. The upper punch 1068 has a flange 1076 on its side wall for determining the stroke thereof. A packing 1078 is attached to the lower surface of the flange 1076 for contacting the upper end surface of the refractory casing 1066 to sealingly close the refractory casing 1066. The lower punch 1064 has a passage 1080 defined therein for passing therethrough a heating fluid for heating the space 1074 in the refractory casing 1066 and a cooling fluid for cooling the space 1074 in the refractory casing 1066.

Figure 36:
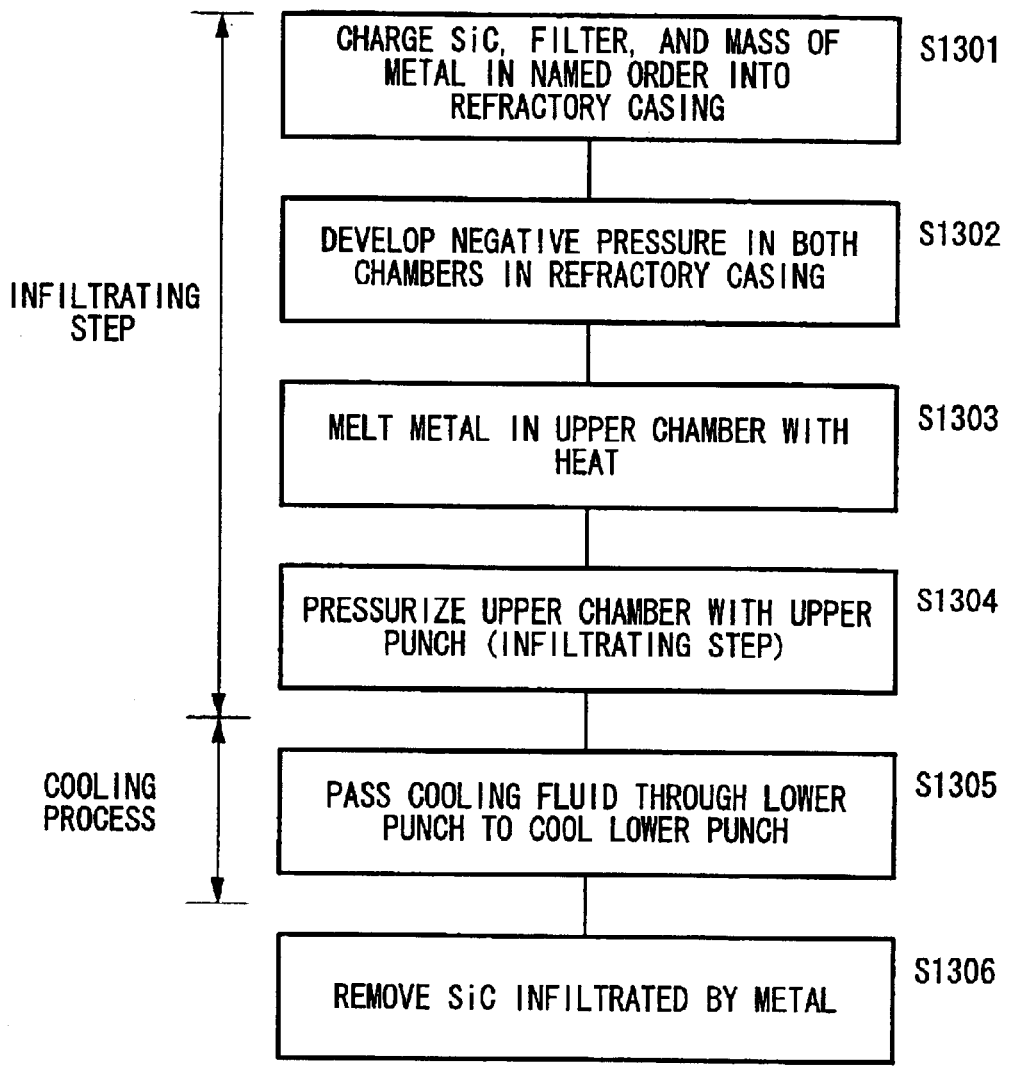
FIG. 36 is a flowchart of a manufacturing process according to a fourth embodiment of the present invention.

The eighth manufacturing process is carried out in successive steps shown in FIG. 36.

Bodies of SiC 1020, a filter 1054 of porous ceramic material, and masses of the metal 14, which are arranged successively upwardly in the order named, are charged into the space 1074 in the refractory casing 1066 in step S1301. The porous ceramic material of the filter 1054 should preferably have a porosity ranging from 40% to 90% and pore diameters ranging from 0.5 mm to 3.0 mm, and more preferably have a porosity ranging from 70% to 85% and pore diameters ranging from 1.0 mm to 2.0 mm.

The filter 1054 functions as a partition plate separating the bodies of the SiC 1020 and the masses of the metal 14 from each other to keep them out of contact with each other. The portion of the space 1074 in which the masses of the metal 14 are set above the filter 1054 is defined as an upper chamber 1074a, and the portion of the space 1074 in which the bodies of the SiC 1020 are set beneath the filter 1054 is defined as a lower chamber 1074b.

After the refractory casing 1066 is sealed, the refractory casing 1066 is evacuated through the suction pipe 1072 to develop a negative pressure in the chambers 1074a, 1074b in the refractory casing 1066 in step S1302.

Then, the heater 1070 is energized to heat the masses of the metal 14 in the upper chamber 1074a into a molten state in step S1303. At the same time that the heater 1070 is energized, the heating fluid may be passed through the passage 1080 in the lower punch 1064 to heat the space 1074 in the refractory casing 1066.

When the molten metal 14 in the upper chamber 1074a reaches a predetermined temperature, the upper punch 1068 is moved downwardly to pressurize the upper chamber 1074a to a predetermined pressure in step S1304. At this time, the packing 1078 mounted on the flange 1076 of the upper punch 1068 and the upper end surface of the refractory casing 1066 are held and pressed against each other, sealing the refractory casing 1066 to prevent the molten metal 14 from leaking out of the refractory casing 1066.

The molten metal 14 in the upper chamber 1074a under the predetermined pressure is pushed through the filter 1054 into the lower chamber 1074b under the pressure in the upper chamber 1074a, and is infiltrated into the SiC 1020 placed in the lower chamber 1074b.

When an endpoint preset by a given time management plan is reached, i.e., when the infiltration of the SiC 20 with the molten metal 14 is saturated, the cooling fluid is passed through the passage 1080 in the lower punch 1064 to cool the refractory casing 1066 progressively upwardly, thus solidifying the molten metal 14 infiltrated into the SiC 1020 in step S1305. Until the solidification of the molten metal 14 is completed, the space 1074 in the refractory casing 1066 remains pressurized by the upper punch 1068 and the lower punch 1064.

When the solidification of the molten metal 14 is completed, the SiC 1020 infiltrated by the metal 14 is removed from the refractory casing 1066 in step S1306.

In the above eighth manufacturing process, the SiC 1020 and the metal 14 are heated while being sufficiently deaerated, and after the metal 14 is melted, it is quickly brought into contact with the SiC 1020, and the SiC 1020 and the molten metal 14 are pressurized and continuously held under pressure until the cooling process is completed. Therefore, the SiC 1020 can efficiently be infiltrated by the metal 14. While the SiC 1020 is infiltrated by the molten metal 14 under a negative pressure in the above embodiment, the SiC 1020 may be infiltrated by the molten metal 14 under the normal pressure.

As described above, after the molten metal 14 and the SiC 1020 are pressurized, they are brought into contact with each other to infiltrate the molten metal 14 into the SiC 1020. Therefore, any reduction in the pressure at the time the molten metal 14 and the SiC 1020 are brought into contact with each other is minimized, and the molten metal 14 and the SiC 1020 are well kept under pressure when the SiC 1020 is infiltrated by the molten metal 14.

Figure 37A:
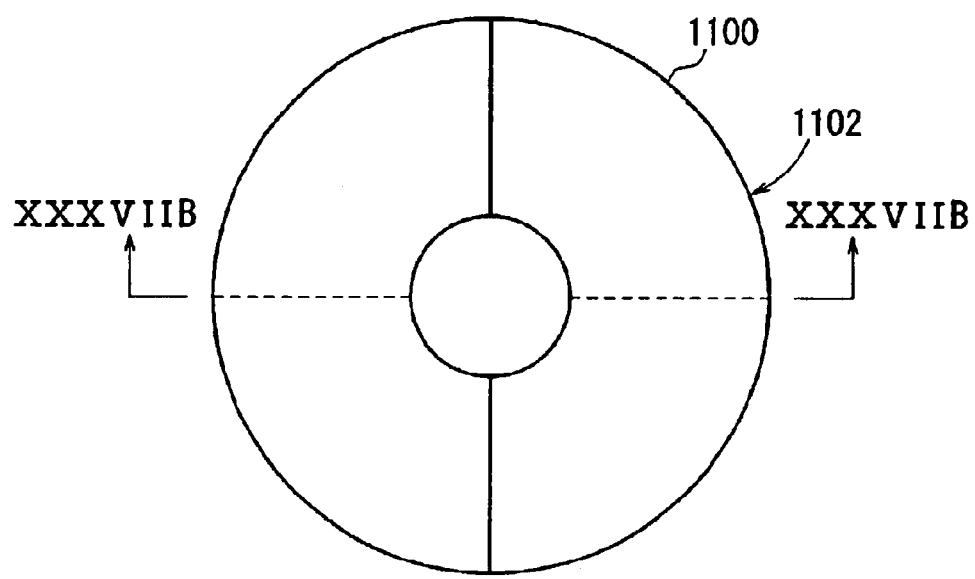
FIG. 37A is a plan view of a packing.
Figure 37B:
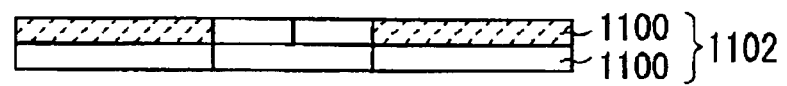
FIG. 37B is a cross-sectional view taken along line XXXVIIB—XXXVIIB of FIG. 37A.
Figure 38:
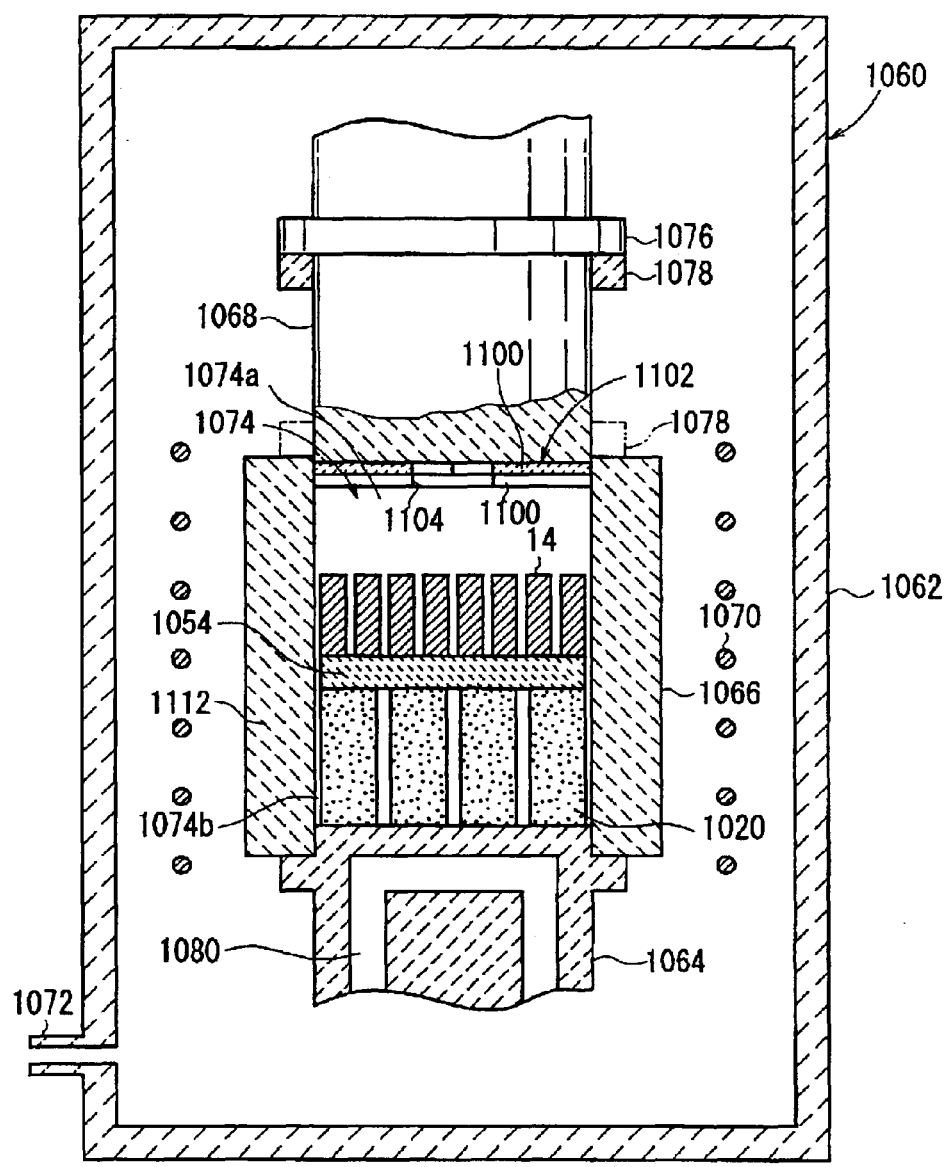
FIG. 38 is a cross-sectional view of another hot press for use in the eighth manufacturing process.

In the above embodiment, the packing 1078 is mounted on the lower surface of the flange 1076 on the upper punch 1068 in order to prevent the molten metal 14 from leaking out of the refractory casing 1066. However, as indicated by the two-dot-and-dash lines in FIG. 35, the packing 1078 may be mounted on the upper end surface of the refractory casing 1066. Alternatively, as shown in FIGS. 37A and 37B, a packing assembly 1102 comprising two annular split packings 1100 may be mounted on the lower end of the upper punch 1068, as shown in FIG. 38. When the molten metal 14 enters a space 1104 in the packing assembly 1102, each of the split packings 1100 is spread radially outwardly against the refractory casing 1066, thus sealing the upper chamber 1074a to prevent the molten metal 14 from leaking out of the refractory casing 1066.

A modification of the eighth manufacturing process will be described below with reference to FIGS. 30 and 40. Those parts in FIG. 39 which are identical to those shown in FIG. 35 are denoted by identical reference characters, and will not be described in detail below.

Figure 39:
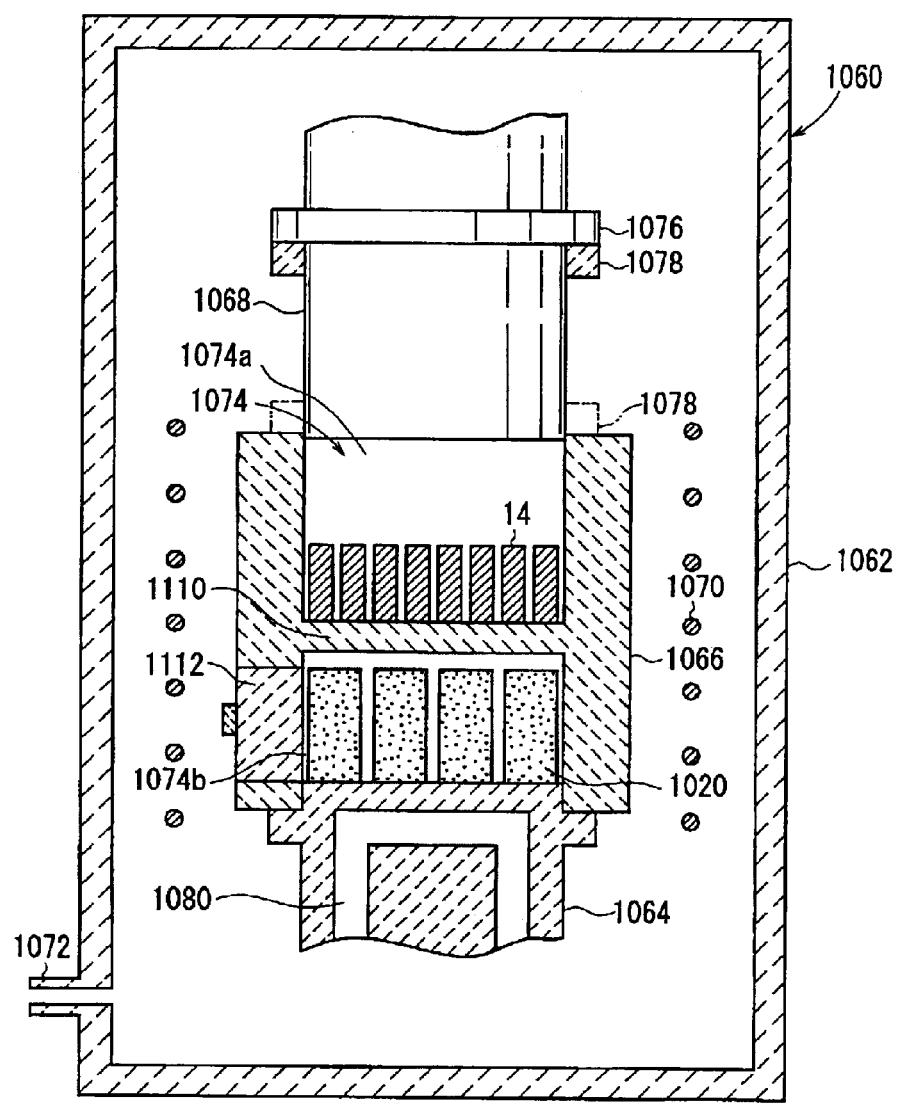
FIG. 39 is a cross-sectional view of a hot press for use in a modification of the eighth manufacturing process.

The modification of the eighth manufacturing process employs a hot press furnace 1060 shown in FIG. 39. The hot press furnace 1060 includes a filter 1110 of porous ceramic material fixedly positioned vertically centrally in the space 1074 in the refractory casing 1066, and a door 1112 openably and closably disposed in a side wall of the lower chamber 1074b. The portion of the space 1074 which extends above the filter 1110 serves as the upper chamber 1074a, and the portion of the space 1074 which extends beneath the filter 1110 serves as the lower chamber 1074b. The door 1112 disposed in the side wall of the lower chamber 1074b is of such a structure that when the door 1112 is closed, it seals the lower chamber 1074b.

Figure 40:
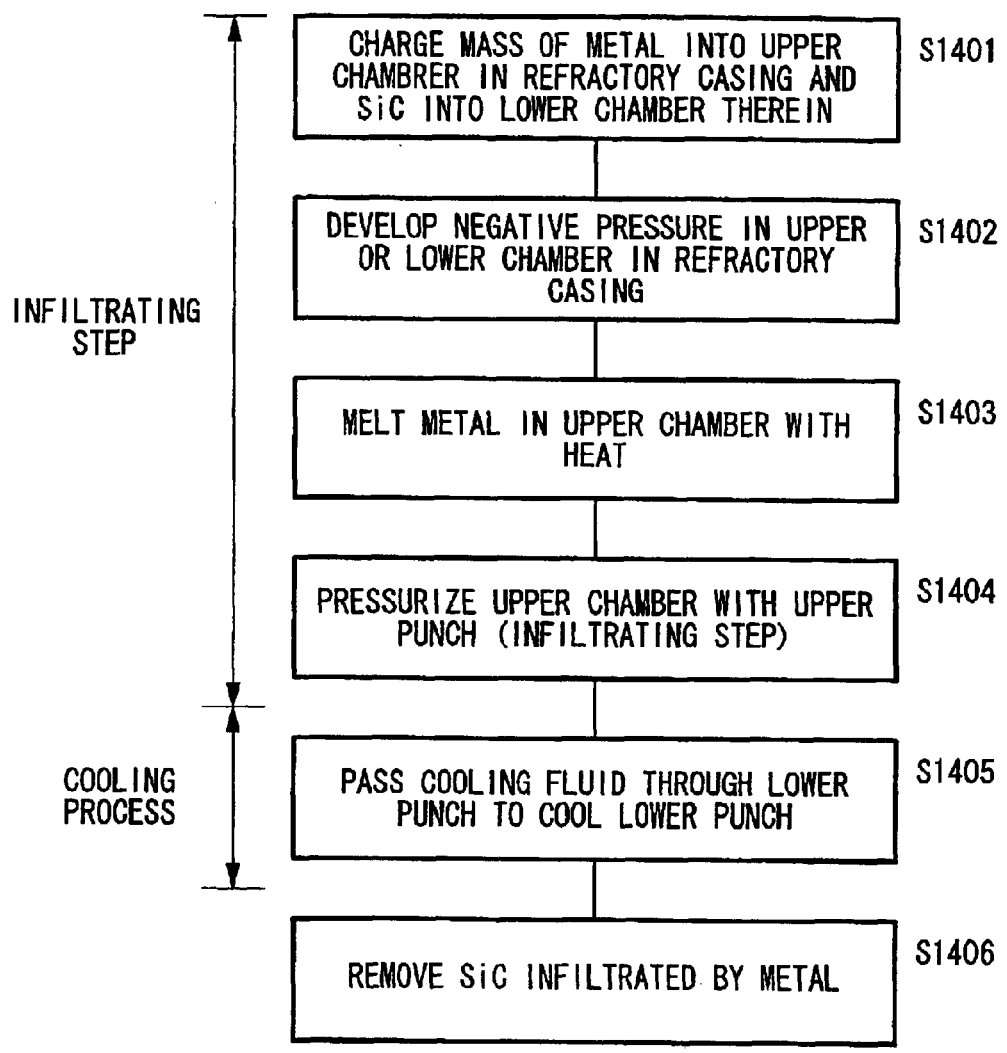
FIG. 40 is a flowchart of the modification of the eighth manufacturing process.

The modification of the eighth manufacturing process is carried out in successive steps shown in FIG. 40.

The masses of the metal 14 are charged into the upper chamber 1074a in the refractory casing 1066, and the door 1112 is opened and the bodies of the SiC 1020 are charged into the lower chamber 1074b in step S1401.

Then, the door 1112 is closed to seal the lower chamber 1074b, and the hot press furnace 1060 is sealed. Thereafter, the refractory casing 1066 is evacuated through the suction pipe 1072, developing a negative pressure in the chambers 1074a, 1074b in the refractory casing 1066 in step S1402.

Then, the heater 1070 is energized to heat the masses of the metal 14 in the upper chamber 1074a into a molten state in step S1403. At the same time that the heater 1070 is energized, the heating fluid may be passed through the passage 1080 in the lower punch 1064 to heat the space 1074 in the refractory casing 1066.

When the molten metal 14 in the upper chamber 1074a reaches a predetermined temperature, the upper punch 1068 is moved downwardly to pressurize the upper chamber 1074a to a predetermined pressure in step S1404.

The molten metal 14 in the upper chamber 1074a under the predetermined pressure is pushed through the filter 1110 into the lower chamber 1074b under the pressure in the upper chamber 1074a, and infiltrates into the SIC 1020 placed in the lower chamber 1074b.

When an endpoint preset by a given time management plan is reached, the cooling fluid is passed through the passage 1080 in the lower punch 1064 to cool the refractory casing 1066 progressively upwardly, thus solidifying the molten metal 14 infiltrated into the SiC 1020 in step S1405.

When the solidification of the molten metal 14 is completed, the SiC 1020 infiltrated by the metal 14 is removed from the refractory casing 1066 in step S1406.

The above modified manufacturing process can efficiently infiltrate the molten metal 14 into the SiC 1020 as is the case with the eighth manufacturing process. According to the modified process, after the molten metal 14 and the SiC 1020 are pressurized, they are brought into contact with each other to infiltrate the molten metal 14 into the SiC 1020. Therefore, any reduction in the pressure at the time the molten metal 14 and the SiC 1020 are brought into contact with each other is minimized, and the molten metal 14 and the SiC 1020 are well kept under pressure when the SiC 1020 is infiltrated by the molten metal 14. While the SiC 1020 is infiltrated by the molten metal 14 under a negative pressure in the above modification, the SIC 1020 may be infiltrated by the molten metal 14 under the normal pressure.

Figure 41:
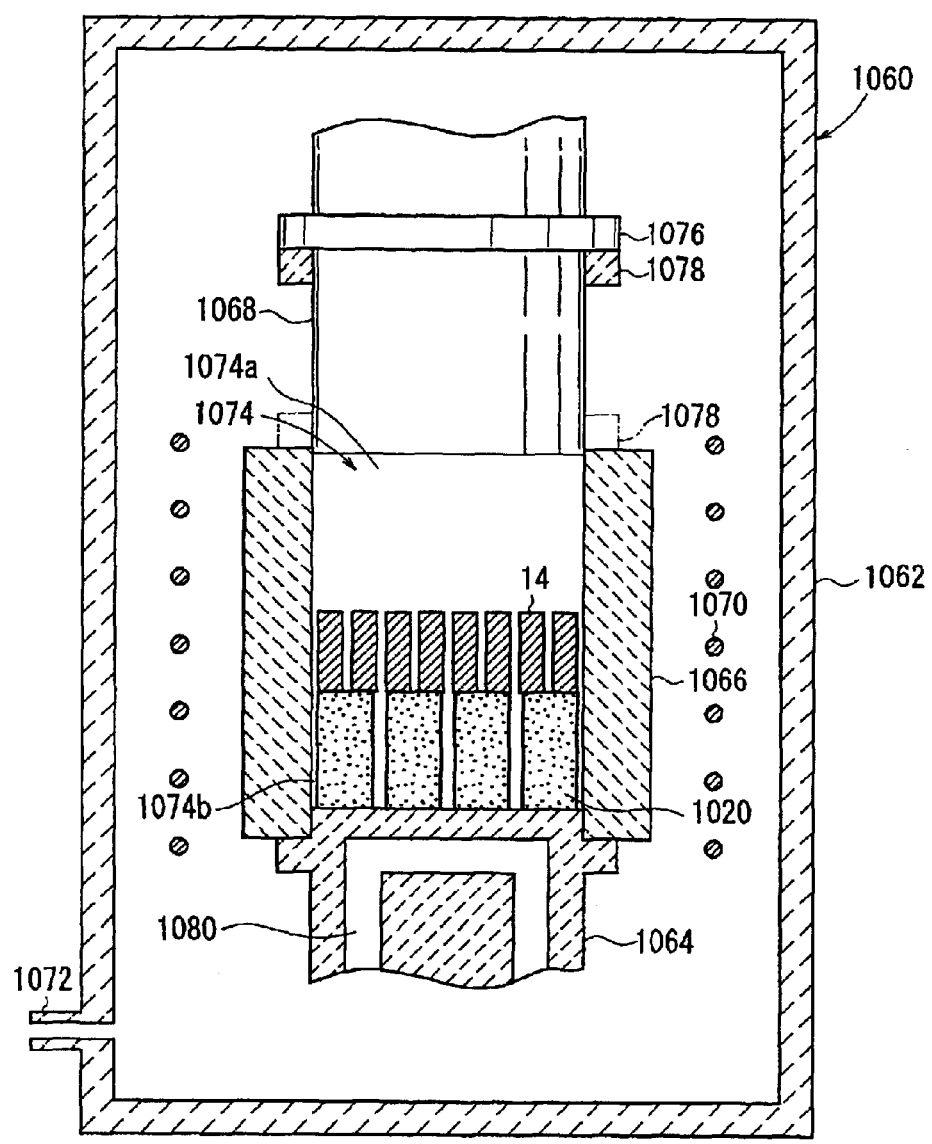
FIG. 41 is a cross-sectional view of a hot press for use in a ninth manufacturing process.

A manufacturing process (ninth manufacturing process) according to the fifth embodiment in which the porous sintered body 12 is made of SiC will be described below with reference to FIGS. 41, 42. Those parts in FIG. 41 which are identical to those shown in FIG. 35 are denoted by identical reference characters, and will not be described in detail below.

The ninth manufacturing process is essentially the same in principle as the manufacturing process according to the fourth embodiment, but differs therefrom in that in the infiltrating process, the SiC 1020 and the metal 14 are brought into contact with each other under a negative pressure or normal pressure, and then heated to melt the. metal 14.

Specifically, as shown in FIG. 35, the filter 1054 is not charged, but bodies of the SiC 1020 and masses of the metal 14, which are arranged successively upwardly in the order named, are charged into the refractory casing 1066 of the hot press furnace 1060 which is used in the eighth manufacturing process according to the third embodiment.

Figure 42:
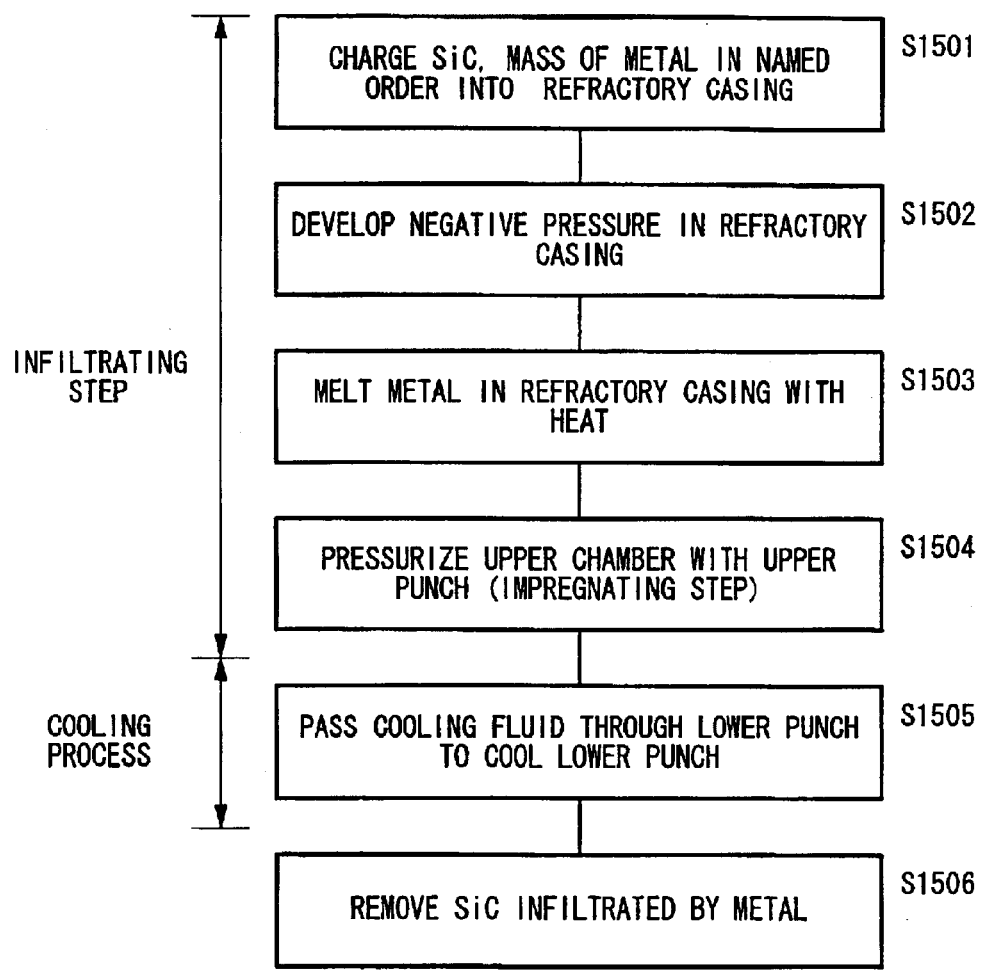
FIG. 42 is a flowchart of the ninth manufacturing process.

The ninth manufacturing process according to the fifth embodiment is carried out in successive steps shown in FIG. 42.

Bodies of the SiC 1020 and masses of the metal 14, which are arranged successively upwardly in the order named, are charged into the space 74 in the refractory casing 66 in step S1501.

After the hot press furnace 1060 is sealed, the refractory casing 1066 is evacuated through the suction pipe 1072 to develop a negative pressure in the refractory casing 1066 in step S1502.

Then, the heater 1070 is energized to heat the masses of the metal 14 in the upper chamber 1074a into a molten state in step S1503. At the same time that the heater 1070 is energized, the heating fluid may be passed through the passage 1080 in the lower punch 1064 to heat the space 1074 in the refractory casing 1066.

When the molten metal 14 in the refractory casing 1066 reaches a predetermined temperature, the upper punch 1068 is moved downwardly to pressurize the refractory casing 1066 to a predetermined pressure in step S1504.

The molten metal 14 under the predetermined pressure is forced to infiltrate into the SiC 1020 under the pressure in the refractory casing 1066.

When an endpoint preset by a given time management plan is reached, i.e., when the infiltration of the SiC 1020 with the molten metal 14 is saturated, the cooling fluid is passed through the passage 1080 in the lower punch 1064 to cool the refractory casing 1066 progressively upwardly, thus solidifying the molten metal 14 infiltrated into the SiC 1020 in step S1505. Until the solidification of the molten metal 14 is completed, the space 1074 in the refractory casing 1066 remains pressurized by the upper punch 1068 and the lower punch 1064.

When the solidification of the molten metal 14 is completed, the SiC 1020 infiltrated by the metal 14 is removed from the refractory casing 1066 in step S1506.

In the ninth manufacturing process, the SiC 1020 and the metal 14 are heated while being sufficiently deaerated, and after the metal 14 is melted while the metal 14 and the SiC 1020 are being held in contact with each other, the space 1074 in the refractory casing 1066 is pressurized and continuously held under pressure until the cooling process is completed. Therefore, the SiC 1020 can efficiently be infiltrated by the metal 14.

The heat sink material according to the present invention has characteristics balanced against the coefficient of thermal expansion and the coefficient of thermal conductivity of actual electronic parts (including semiconductor devices), and also has a small porosity. The heat sink material thus has a high mechanical strength and is of high quality.

Although certain preferred embodiments of the present invention have been shown and described in detail, it should be understood that various changes and modifications may be made therein without departing from the scope of the appended claims.

What is claimed is:

1. A heat sink material comprising carbon or graphite and a metal, said metal selected from the group consisting of Bi, Sb, Ga, and graphite cast iron, or an alloy containing said metal, and wherein said metal has a solidification temperature of at least 300° C.

2. A heat sink material comprising carbon or graphite and a metal, said metal selected from the group consisting of Bi, Sb, Ga, and graphite cast iron, or an alloy containing said metal, and wherein said metal has a property of inhibiting segregation of the metal.

3. A heat sink material comprising carbon or graphite and a metal, said metal selected from the group consisting of Bi, Sb, Ga, and graphite cast iron, or an alloy containing said metal, and wherein said metal has a property for improving wettability of the metal with respect to a surface of the heat sink material.

4. A heat sink material comprising carbon or graphite and a metal, said metal selected from the group consisting of Bi, Sb, Ga, and graphite cast iron, or an alloy containing said metal, and wherein said metal has a property of expansion upon solidification or a property of inhibiting a solidification shrinkage.

5. A heat sink material according to claim 4, wherein said heat sink material has a coefficient of thermal conductivity of 300 W/mK or higher either on the average in the directions of three orthogonal axes or in the direction of any one of the three orthogonal axes.

6. A heat sink material according to claim 4, wherein said carbon or said graphite has a coefficient of thermal conductivity of 150 W/mK or higher.

7. A heat sink material according to claim 4, wherein a porous sintered body having a network structure obtained by sintering said carbon or said graphite is infiltrated by said metal.

8. A heat sink material according to claim 7, wherein said porous sintered body has a porosity ranging from 10 vol. % to 50 vol. % and an average pore diameter ranging from 0.1 $\mu$m to 200 $\mu$m.

9. A heat sink material according to claim 7, wherein said carbon or said graphite has a volume ratio ranging from 50 vol. % to 90 vol. % and said metal has a volume ratio ranging from 50 vol. % to 10 vol. %.

10. A heat sink material according to claim 7, further comprising an additive added to said carbon or said graphite for reducing a closed porosity achieved when said carbon or said graphite is sintered.

11. A heat sink material according to claim 10, wherein said additive comprises SiC and/or Si.

12. A heat sink material according to claim 7, further comprising an element added to said metal for improving the wettability at the interface between said porous sintered body and said metal.

13. A heat sink material according to claim 12, wherein said element comprises at least one element selected from the group consisting of Te, Bi, Pb, Sn, Se, Li, Sb, Tl, and Cd.

14. A heat sink material according to claim 7, further comprising an element added to said metal for improving a match and close contact between said porous sintered body and said metal.

15. A heat sink material according to claim 7, further comprising a carbide layer formed on a surface of said carbon or said graphite.

16. A heat sink material according to claim 15, wherein said carbide layer is formed on the basis of a reaction between at least said carbon or said graphite and an additive element added thereto.

17. A heat sink material according to claim 16, wherein said additive element comprises at least one element selected from the group consisting of Nb, Cr, Zr, Be, V, Mo, Al, Ta, Mn, Si, Fe, Co, Ni, Mg, Ca, W, Ti, B, and mish metal.

18. A heat sink material according to claim 4, wherein a powder of said carbon or said graphite and water or a binder constitutes a mixture, and the mixture is formed into a preformed body under a predetermined pressure or sintered into a formed body, said preformed body or said formed body being infiltrated by said metal.

19. A heat sink material according to claim 18, wherein said powder of said carbon or said graphite has an average particle size ranging from 1 $\mu$m to 500 $\mu$m, an average ratio of length of each particle of said powder is 1:5 or less between a direction in which said particle has a minimum length and a direction in which said particle has a maximum length.

20. A heat sink material according to claim 18, wherein said carbon or said graphite has a volume ratio ranging from 20 vol.% to 80 vol.% and said metal has a volume ratio ranging from 80 vol.% to 20 vol.%.

21. A heat sink material according to claim 18, further comprising an element added to said metal for improving the wettability at the interface between said porous sintered body and said metal.

22. A heat sink material according to claim 21, wherein said additive element comprises an element selected from the group consisting of Bi, Te, Sn, Pb, Se, Li, Sb, Tl, and Cd.

23. A heat sink material according to claim 22, wherein said additive element comprises an additive element which forms a solid solution with copper only at a weight ratio of at most 0.5 wt. %.

24. A heat sink material according to claim 18, further comprising an additive element for increasing the bonding strength between said carbon or said graphite and said metal when said heat sink material is molded.

25. A heat sink material according to claim 24, wherein said additive element comprises an element selected from the group consisting of Nb, Zr, Cr, Be, V, Mo, Al, Ta, Mn, Si, Fe, Co, Ni, Mg, Ca, W, Ti, B, and mish metal.

26. A heat sink material according to claim 18, further comprising an additive element added to said carbon or said graphite for allowing the heat sink material to be reheated after said heat sink material is molded.

27. A heat sink material according to claim 26, wherein said heat sink material is formed on the basis of a reaction between at least said carbon or said graphite and said additive element added thereto.

28. A heat sink material according to claim 27, wherein said additive element comprises an element selected from the group consisting of Nb, Zr, Cr, Be, V, Mo, Al, Ta, Mn, Si, Fe, Co, Ni, Mg, Ca, W, Ti, B, and mish metal.

29. A heat sink material according to claim 4, wherein a powder of said carbon or said graphite and a powder of said metal are mixed to obtain a mixture, and the mixture is molded under a predetermined pressure.

30. A heat sink material according to claim 4, wherein a liquid phase or a solid-liquid phase of said metal and a powder of said carbon or said graphite are mixed to obtain a mixture, and said mixture is cast into a predetermined shape.

31. A heat sink material according to claim 4, wherein a powder of said carbon or said graphite is infiltrated by said metal.

32. A heat sink material according to claim 4, wherein a crushed and torn material of said carbon or said graphite and a powder of said metal are mixed to obtain a mixture, and said mixture is molded under a predetermined pressure.

33. A heat sink material according to claim 4, further comprising a carbide of an additive element formed on a surface of said carbon or said graphite.

34. A heat sink material according to claim 33, wherein said additive element comprises an element selected from the group consisting of Nb, Zr, Cr, Be, V, Mo, Al, Ta, Mn, Si, Fe, Co, Ni, Mg, Ca, W, Ti, B, and mish metal.

35. A heat sink material according to claim 4, wherein said heat sink material has a residual porosity of 5% or less.

* * * * *

UNITED STATES PATENT AND TRADEMARK OFFICE
CERTIFICATE OF CORRECTION

PATENT NO. : 6,927,421 B2
DATED : August 9, 2005
INVENTOR(S) : Shuhei Ishikawa et al.

It is certified that error appears in the above-identified patent and that said Letters Patent is hereby corrected as shown below:

<u>Title page,</u>
Item [30], Foreign Application Priority Data, add
-- Oct. 26, 2001   (JP) ................... 2001-328954 --.

Signed and Sealed this

Fourteenth Day of March, 2006

JON W. DUDAS
*Director of the United States Patent and Trademark Office*